(12) United States Patent
Huang et al.

(10) Patent No.: US 12,159,839 B2
(45) Date of Patent: *Dec. 3, 2024

(54) SEMICONDUCTOR PACKAGES

(71) Applicant: Taiwan Semiconductor Manufacturing Company, Ltd., Hsinchu (TW)

(72) Inventors: Tzu-Sung Huang, Tainan (TW); Hsiu-Jen Lin, Zhubei (TW); Hao-Yi Tsai, Hsinchu (TW); Ming Hung Tseng, Toufen Township (TW); Tsung-Hsien Chiang, Hsinchu (TW); Tin-Hao Kuo, Hsinchu (TW); Yen-Liang Lin, Taichung (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 16 days.

This patent is subject to a terminal disclaimer.

(21) Appl. No.: 17/986,456

(22) Filed: Nov. 14, 2022

(65) Prior Publication Data
US 2023/0075602 A1 Mar. 9, 2023

Related U.S. Application Data

(60) Continuation of application No. 17/026,898, filed on Sep. 21, 2020, now Pat. No. 11,502,039, which is a (Continued)

(51) Int. Cl.
*H01L 23/538* (2006.01)
*H01L 21/768* (2006.01)
(Continued)

(52) U.S. Cl.
CPC .... *H01L 23/5384* (2013.01); *H01L 21/76816* (2013.01); *H01L 23/49838* (2013.01);
(Continued)

(58) Field of Classification Search
None
See application file for complete search history.

(56) References Cited

U.S. PATENT DOCUMENTS 7,601,612 B1 10/2009 Master et al.
7,626,274 B2 12/2009 Amagai
(Continued)

FOREIGN PATENT DOCUMENTS

CN 101379618 A 3/2009
CN 108292610 A 7/2018
(Continued)

OTHER PUBLICATIONS

Vianco, P.T. et al., "Solid State Intermetallic Compound Growth Between Copper and High Temperature, Tin-Rich Solders-Part I: Experimental Analysis," Journal of Electronic Materials, vol. 23, No. 8, pp. 721-727, Mar. 22, 1994.

*Primary Examiner* — Erik Kielin
(74) *Attorney, Agent, or Firm* — Slater Matsil, LLP

(57) ABSTRACT

In an embodiment, a device includes: a back-side redistribution structure including: a metallization pattern on a first dielectric layer; and a second dielectric layer on the metallization pattern; a through via extending through the first dielectric layer to contact the metallization pattern; an integrated circuit die adjacent the through via on the first dielectric layer; a molding compound on the first dielectric layer, the molding compound encapsulating the through via and the integrated circuit die; a conductive connector extending through the second dielectric layer to contact the metallization pattern, the conductive connector being electrically connected to the through via; and an intermetallic compound at the interface of the conductive connector and the metallization pattern, the intermetallic compound extending only partially into the metallization pattern.

20 Claims, 22 Drawing Sheets

Related U.S. Application Data division of application No. 15/907,869, filed on Feb. 28, 2018, now Pat. No. 10,784,203.

(60) Provisional application No. 62/586,413, filed on Nov. 15, 2017.

(51) Int. Cl.
    *H01L 23/00*     (2006.01)
    *H01L 23/498*     (2006.01)

(52) U.S. Cl.
CPC ...... *H01L 23/5385* (2013.01); *H01L 23/5386* (2013.01); *H01L 24/11* (2013.01); *H01L 24/16* (2013.01); *H01L 24/19* (2013.01); *H01L 24/32* (2013.01); *H01L 24/48* (2013.01); *H01L 24/73* (2013.01); *H01L 24/92* (2013.01); *H01L 2224/04105* (2013.01); *H01L 2224/12105* (2013.01); *H01L 2224/32145* (2013.01); *H01L 2224/32225* (2013.01); *H01L 2224/48091* (2013.01); *H01L 2224/48227* (2013.01); *H01L 2224/73265* (2013.01); *H01L 2224/73267* (2013.01); *H01L 2224/92244* (2013.01); *H01L 2224/97* (2013.01); *H01L 2225/1035* (2013.01); *H01L 2924/10252* (2013.01); *H01L 2924/10253* (2013.01); *H01L 2924/10271* (2013.01); *H01L 2924/10272* (2013.01); *H01L 2924/10329* (2013.01); *H01L 2924/10331* (2013.01); *H01L 2924/10332* (2013.01); *H01L 2924/10333* (2013.01); *H01L 2924/10335* (2013.01); *H01L 2924/15311* (2013.01); *H01L 2924/35121* (2013.01)

(56) References Cited

U.S. PATENT DOCUMENTS

| | | | |
|---|---|---|---|
| 8,361,842 B2 | 1/2013 | Yu et al. | |
| 8,680,647 B2 | 3/2014 | Yu et al. | |
| 8,703,542 B2 | 4/2014 | Lin et al. | |
| 8,759,964 B2 | 6/2014 | Pu et al. | |
| 8,778,738 B1 | 7/2014 | Lin et al. | |
| 8,785,299 B2 | 7/2014 | Mao et al. | |
| 8,803,306 B1 | 8/2014 | Yu et al. | |
| 8,809,996 B2 | 8/2014 | Chen et al. | |
| 8,829,676 B2 | 9/2014 | Yu et al. | |
| 8,877,554 B2 | 11/2014 | Tsai et al. | |
| 10,361,167 B2 | 7/2019 | Liu et al. | |
| 11,502,039 B2 * | 11/2022 | Huang | H01L 24/81 |
| 2003/0104183 A1 * | 6/2003 | Narizuka | H01L 24/02 |
| | | | 428/209 |
| 2009/0236686 A1 | 9/2009 | Shim et al. | |
| 2010/0096171 A1 | 4/2010 | Lee et al. | |
| 2011/0122592 A1 | 5/2011 | Ganesan et al. | |
| 2011/0291288 A1 | 12/2011 | Wu et al. | |
| 2012/0248599 A1 | 10/2012 | Ring | |
| 2013/0026468 A1 | 1/2013 | Yoshimuta et al. | |
| 2013/0062760 A1 | 3/2013 | Hung et al. | |
| 2013/0062761 A1 | 3/2013 | Lin et al. | |
| 2013/0168848 A1 | 7/2013 | Lin et al. | |
| 2013/0295725 A1 | 11/2013 | Park et al. | |
| 2013/0307140 A1 | 11/2013 | Huang et al. | |
| 2014/0090880 A1 * | 4/2014 | Chen | H01L 24/16 |
| | | | 174/257 |
| 2014/0183731 A1 | 7/2014 | Lin et al. | |
| 2014/0203429 A1 | 7/2014 | Yu et al. | |
| 2014/0225222 A1 | 8/2014 | Yu et al. | |
| 2014/0252646 A1 | 9/2014 | Hung et al. | |
| 2014/0264930 A1 | 9/2014 | Yu et al. | |
| 2015/0048503 A1 | 2/2015 | Chiu et al. | |
| 2015/0145142 A1 | 5/2015 | Lin et al. | |
| 2015/0290746 A1 | 10/2015 | Van Veen et al. | |
| 2015/0340328 A1 | 11/2015 | Gandhi | |
| 2016/0240465 A1 | 8/2016 | Chen | |
| 2017/0221830 A1 | 8/2017 | Scanlan et al. | |
| 2017/0250171 A1 | 8/2017 | Yu et al. | |

FOREIGN PATENT DOCUMENTS

| | | |
|---|---|---|
| KR | 20120110058 A | 10/2012 |
| KR | 20150040577 A | 4/2015 |
| KR | 20150144305 A | 12/2015 |
| WO | 2017160231 A1 | 9/2017 |

\* cited by examiner

SEMICONDUCTOR PACKAGES

PRIORITY CLAIM AND CROSS-REFERENCE

This application is a continuation of U.S. patent application Ser. No. 17/026,898 filed on Sep. 21, 2020, which is a divisional of U.S. patent application Ser. No. 15/907,869 filed on Feb. 28, 2018, now U.S. Pat. No. 10,784,203, issued on Sep. 22, 2020, which claims the benefits of U.S. Provisional Application No. 62/586,413, filed on Nov. 15, 2017, which applications are hereby incorporated herein.

BACKGROUND

The semiconductor industry has experienced rapid growth due to ongoing improvements in the integration density of a variety of electronic components (e.g., transistors, diodes, resistors, capacitors, etc.). For the most part, improvement in integration density has resulted from iterative reduction of minimum feature size, which allows more components to be integrated into a given area. As the demand for shrinking electronic devices has grown, a need for smaller and more creative packaging techniques of semiconductor dies has emerged. An example of such packaging systems is Package-on-Package (PoP) technology. In a PoP device, a top semiconductor package is stacked on top of a bottom semiconductor package to provide a high level of integration and component density. PoP technology generally enables production of semiconductor devices with enhanced functionalities and small footprints on a printed circuit board (PCB).

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
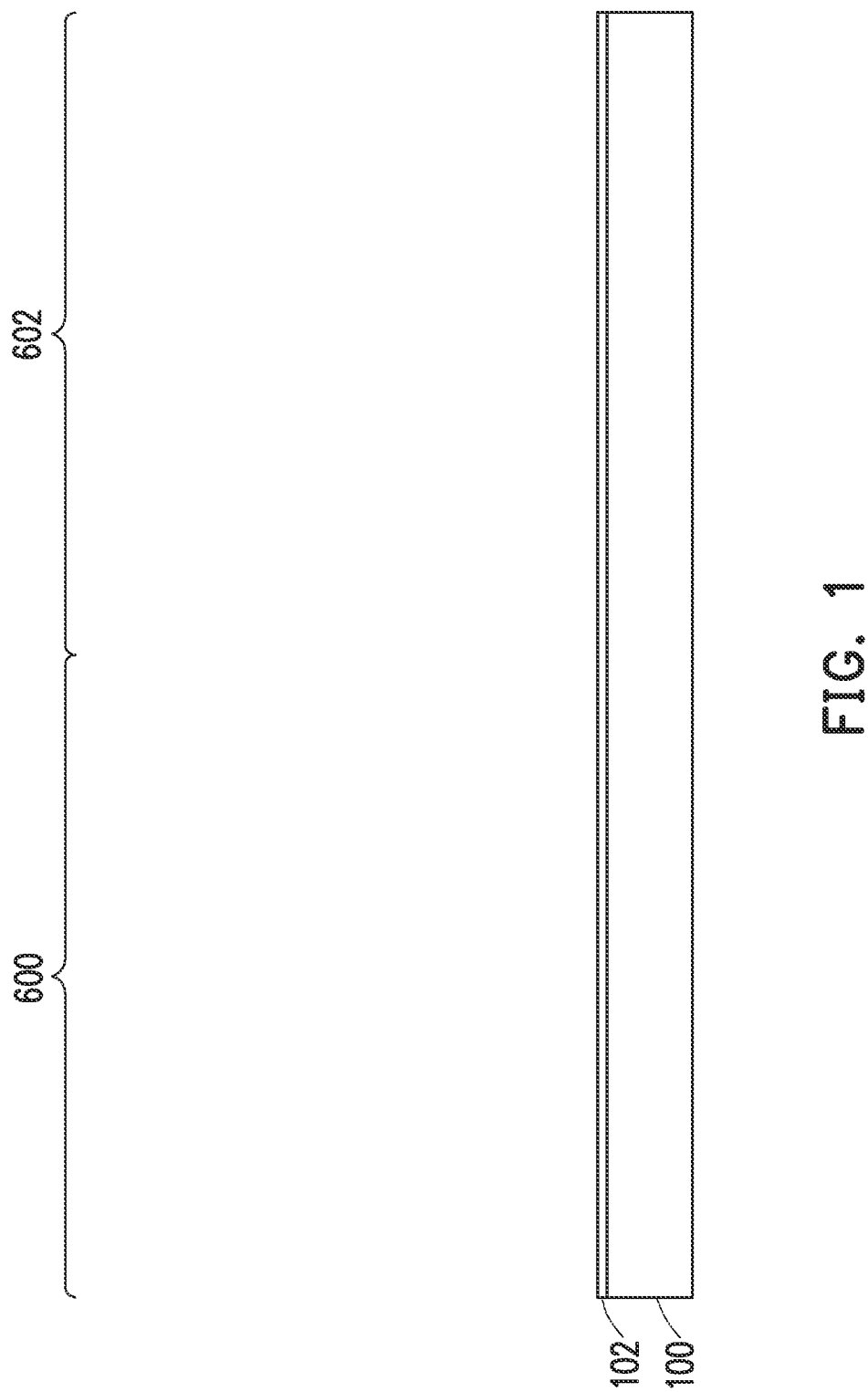
FIGS. 1, 2, 3, 4, 5, 6, 7, 8, 9, 10, 11, 12, 13, 14, 15, and 16 illustrate cross-sectional views of intermediate steps during a process for forming device packages, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In accordance with some embodiments, conductive connectors are formed to bond a device package to metallization patterns of a redistribution structure. Openings are formed exposing the metallization patterns, and the conductive connectors are formed in the openings. The conductive connectors are then reflowed to bond the metallization patterns to a device package. By controlling the widths of the openings and the conductive connectors, the thickness of an IMC formed during the reflow may be controlled. In particular, the thickness of the IMC is controlled to be less than the thickness of the metallization patterns. Delamination of underlying seed layers may thus be avoided during subsequent testing.

FIGS. 1 through 16 illustrate cross-sectional views of intermediate steps during a process for forming first packages 200, in accordance with some embodiments. A first package region 600 and a second package region 602 are illustrated, and a first package 200 is formed in each package region. The first packages 200 may also be referred to as integrated fan-out (InFO) packages.

In FIG. 1, a carrier substrate 100 is provided, and a release layer 102 is formed on the carrier substrate 100. The carrier substrate 100 may be a glass carrier substrate, a ceramic carrier substrate, or the like. The carrier substrate 100 may be a wafer, such that multiple packages can be formed on the carrier substrate 100 simultaneously. The release layer 102 may be formed of a polymer-based material, which may be removed along with the carrier substrate 100 from the overlying structures that will be formed in subsequent steps. In some embodiments, the release layer 102 is an epoxy-based thermal-release material, which loses its adhesive property when heated, such as a light-to-heat-conversion (LTHC) release coating. In other embodiments, the release layer 102 may be an ultra-violet (UV) glue, which loses its adhesive property when exposed to UV lights. The release layer 102 may be dispensed as a liquid and cured, may be a laminate film laminated onto the carrier substrate 100, or may be the like. The top surface of the release layer 102 may be leveled and may have a high degree of coplanarity.

Figure 2:
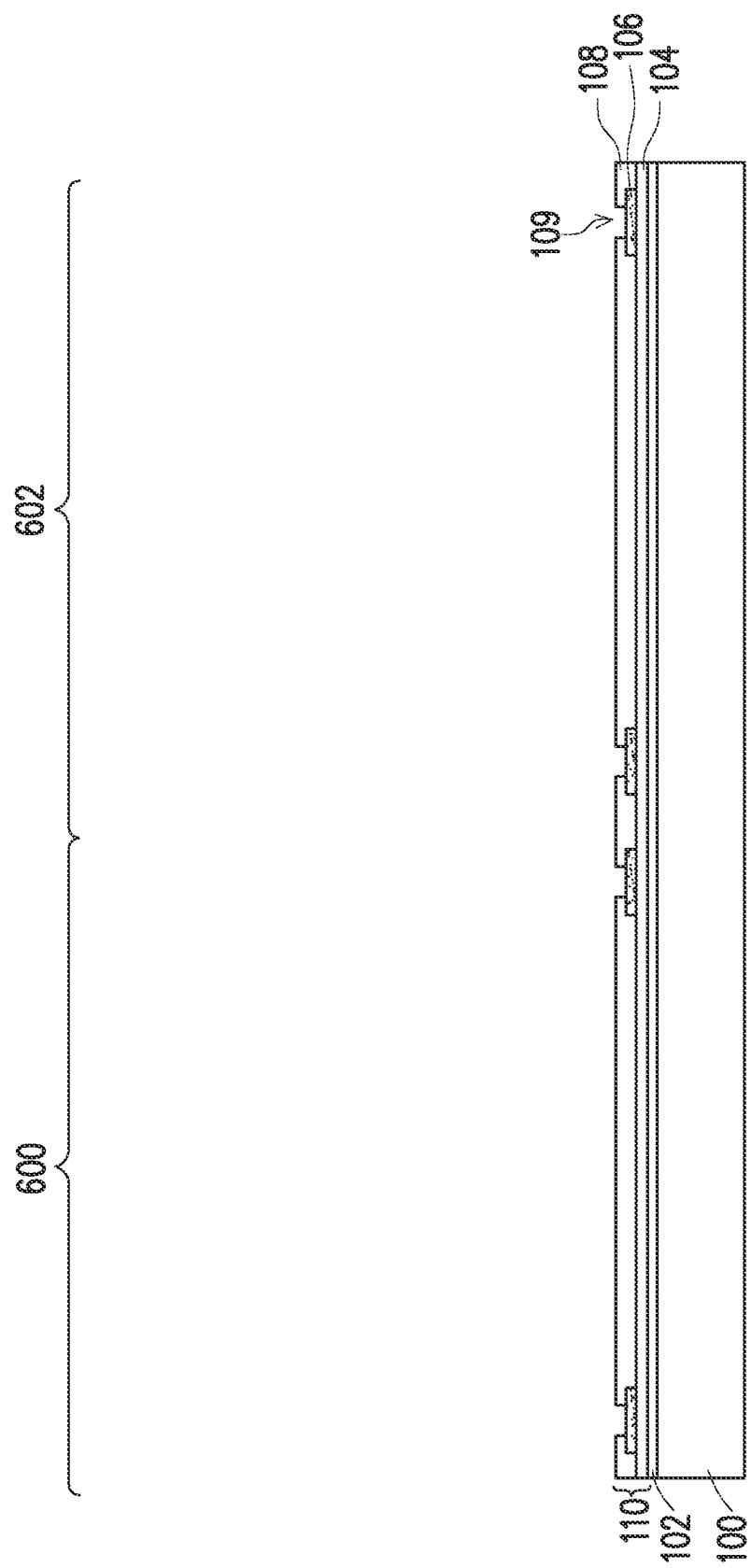

In FIG. 2, a dielectric layer 104, a metallization pattern 106 (sometimes referred to as redistribution layers or redistribution lines), and a dielectric layer 108 are formed. The dielectric layer 104 is formed on the release layer 102. The bottom surface of the dielectric layer 104 may be in contact with the top surface of the release layer 102. In some embodiments, the dielectric layer 104 is formed of a polymer, such as polybenzoxazole (PBO), polyimide, benzocyclobutene (BCB), or the like. In other embodiments, the dielectric layer 104 is formed of a nitride such as silicon nitride; an oxide such as silicon oxide, phosphosilicate glass (PSG), borosilicate glass (BSG), boron-doped phosphosilicate glass (BPSG), or the like; or the like. The dielectric layer 104 may be formed by any acceptable deposition process, such as spin coating, chemical vapor deposition (CVD), laminating, the like, or a combination thereof.

The metallization pattern 106 is formed on the dielectric layer 104. As an example to form metallization pattern 106, a seed layer (not shown) is formed over the dielectric layer 104. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, PVD or the like. A photo resist is then formed and patterned on the seed layer. The photo resist may be formed by spin coating or the like and may be exposed to light for patterning. The pattern of the photo resist corresponds to the metallization pattern 106. The patterning forms openings through the photo resist to expose the seed layer. A conductive material is formed in the openings of the photo resist and on the exposed portions of the seed layer. The conductive material may be formed by plating, such as electroplating or electroless plating, or the like. The conductive material may comprise a metal, like copper, titanium, tungsten, aluminum, or the like. Then, the photo resist and portions of the seed layer on which the conductive material is not formed are removed. The photo resist may be removed by an acceptable ashing or stripping process, such as using an oxygen plasma or the like. Once the photo resist is removed, exposed portions of the seed layer are removed, such as by using an acceptable etching process, such as by wet or dry etching. The remaining portions of the seed layer and conductive material form the metallization pattern 106.

The dielectric layer 108 is formed on the metallization pattern 106 and the dielectric layer 104. In some embodiments, the dielectric layer 108 is formed of a polymer, which may be a photo-sensitive material such as PBO, polyimide, BCB, or the like, that may be patterned using a lithography mask. In other embodiments, the dielectric layer 108 is formed of a nitride such as silicon nitride; an oxide such as silicon oxide, PSG, BSG, BPSG; or the like. The dielectric layer 108 may be formed by spin coating, lamination, CVD, the like, or a combination thereof. The dielectric layer 108 is then patterned to form openings 109 to expose portions of the metallization pattern 106. The patterning may be by an acceptable process, such as by exposing the dielectric layer 108 to light when the dielectric layer 108 is a photo-sensitive material or by etching using, for example, an anisotropic etch.

The dielectric layers 104 and 108 and the metallization pattern 106 may be referred to as a back-side redistribution structure 110. In the embodiment shown, the back-side redistribution structure 110 includes the two dielectric layers 104 and 108 and one metallization pattern 106. In other embodiments, the back-side redistribution structure 110 can include any number of dielectric layers, metallization patterns, and conductive vias. One or more additional metallization pattern and dielectric layer may be formed in the back-side redistribution structure 110 by repeating the processes for forming the metallization pattern 106 and dielectric layer 108. Conductive vias (not shown) may be formed during the formation of a metallization pattern by forming the seed layer and conductive material of the metallization pattern in the opening of the underlying dielectric layer. The conductive vias may therefore interconnect and electrically couple the various metallization patterns.

Figure 3:
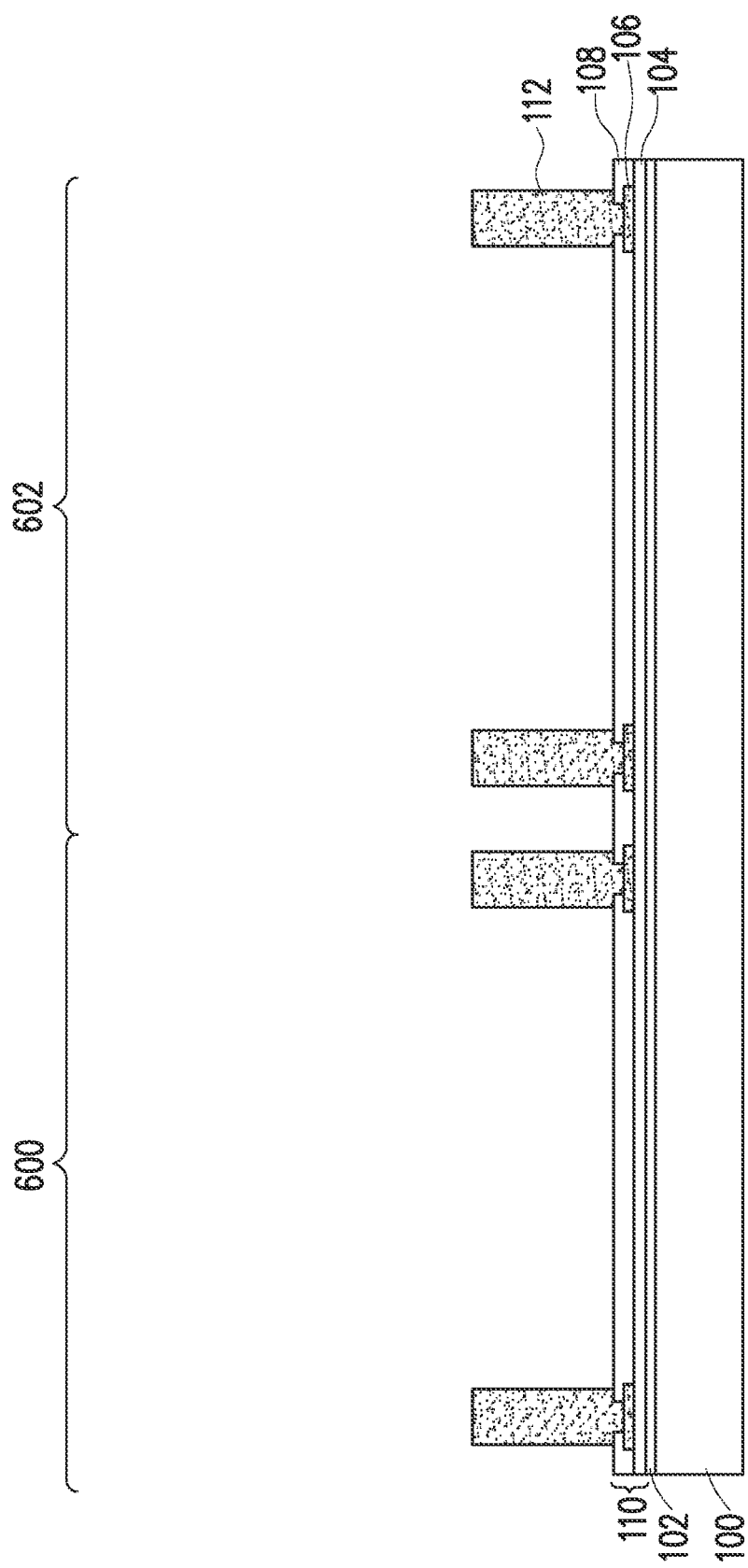

In FIG. 3, through vias 112 are formed. As an example to form the through vias 112, a seed layer 113 (shown below in FIG. 18) is formed over the back-side redistribution structure 110, e.g., on the dielectric layer 108 and portions of the metallization pattern 106 exposed by the openings 109. In some embodiments, the seed layer 113 is a metal layer, which may be a single layer or a composite layer comprising a plurality of sub-layers formed of different materials. In some embodiments, the seed layer 113 comprises a titanium layer and a copper layer over the titanium layer. The seed layer 113 may be formed using, for example, PVD or the like. A photo resist is formed and patterned on the seed layer 113. The photo resist may be formed by spin coating or the like and may be exposed to light for patterning. The pattern of the photo resist corresponds to through vias. The patterning forms openings through the photo resist to expose the seed layer 113. A conductive material is formed in the openings of the photo resist and on the exposed portions of the seed layer 113. The conductive material may be formed by plating, such as electroplating or electroless plating, or the like. The conductive material may comprise a metal, like copper, titanium, tungsten, aluminum, or the like. The photo resist and portions of the seed layer 113 on which the conductive material is not formed are removed. The photo resist may be removed by an acceptable ashing or stripping process, such as using an oxygen plasma or the like. Once the photo resist is removed, exposed portions of the seed layer 113 are removed, such as by using an acceptable etching process, such as by wet or dry etching. The remaining portions of the seed layer 113 and conductive material form the through vias 112.

Figure 4:
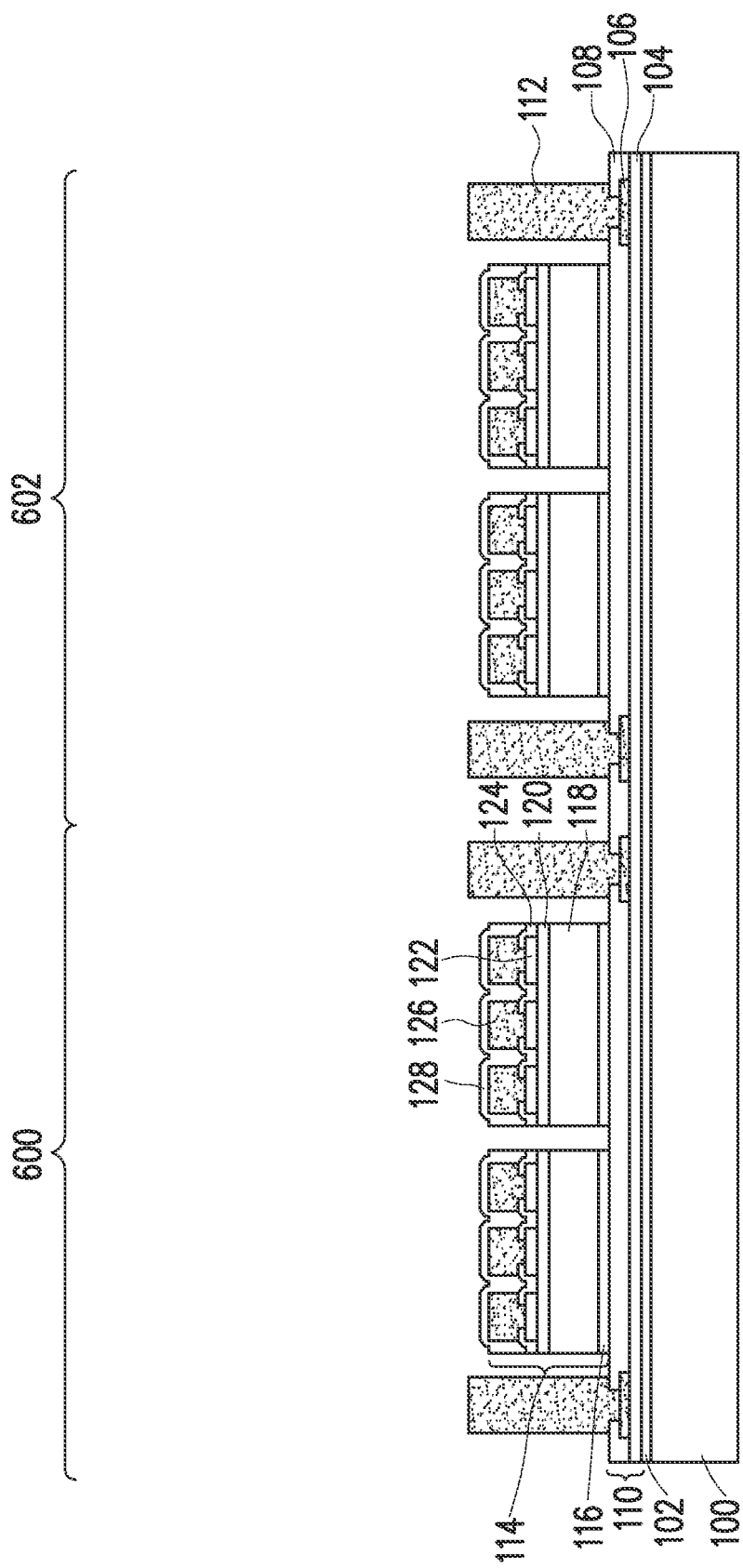

In FIG. 4, integrated circuit dies 114 are adhered to the dielectric layer 108 by an adhesive 116. The integrated circuit dies 114 may be logic dies (e.g., central processing unit, microcontroller, etc.), memory dies (e.g., dynamic random access memory (DRAM) die, static random access memory (SRAM) die, etc.), power management dies (e.g., power management integrated circuit (PMIC) die), radio frequency (RF) dies, sensor dies, micro-electro-mechanical-system (MEMS) dies, signal processing dies (e.g., digital signal processing (DSP) die), front-end dies (e.g., analog front-end (AFE) dies), the like, or a combination thereof. Also, in some embodiments, the integrated circuit dies 114 may be different sizes (e.g., different heights and/or surface areas), and in other embodiments, the integrated circuit dies 114 may be the same size (e.g., same heights and/or surface areas).

Before being adhered to the dielectric layer 108, the integrated circuit dies 114 may be processed according to applicable manufacturing processes to form integrated circuits in the integrated circuit dies 114. For example, the integrated circuit dies 114 each include a semiconductor substrate 118, such as silicon, doped or undoped, or an active layer of a semiconductor-on-insulator (SOI) substrate. The semiconductor substrate may include other semiconductor materials, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates, such as multi-layered or gradient substrates, may also be used. Devices, such as transistors, diodes, capacitors, resistors, etc., may be formed in and/or on the semiconductor substrate 118 and may be interconnected by interconnect structures 120 formed by, for example, metallization patterns in one or more dielectric layers on the semiconductor substrate 118 to form an integrated circuit.

The integrated circuit dies 114 further comprise pads 122, such as aluminum pads, to which external connections are made. The pads 122 are on what may be referred to as respective active sides of the integrated circuit dies 114. Passivation films 124 are on the integrated circuit dies 114 and on portions of the pads 122. Openings are through the passivation films 124 to the pads 122. Die connectors 126, such as conductive pillars (for example, comprising a metal such as copper), are in the openings through the passivation films 124 and are mechanically and electrically coupled to the respective pads 122. The die connectors 126 may be formed by, for example, plating, or the like. The die connectors 126 electrically couple the respective integrated circuits of the integrated circuit dies 114.

A dielectric material 128 is on the active sides of the integrated circuit dies 114, such as on the passivation films 124 and the die connectors 126. The dielectric material 128 laterally encapsulates the die connectors 126, and the dielectric material 128 is laterally coterminous with the respective integrated circuit dies 114. The dielectric material 128 may be a polymer such as PBO, polyimide, BCB, or the like; a nitride such as silicon nitride or the like; an oxide such as silicon oxide, PSG, BSG, BPSG, or the like; the like, or a combination thereof, and may be formed, for example, by spin coating, lamination, CVD, or the like.

The adhesive 116 is on back-sides of the integrated circuit dies 114 and adheres the integrated circuit dies 114 to the back-side redistribution structure 110, such as the dielectric layer 108. The adhesive 116 may be any suitable adhesive, epoxy, die attach film (DAF), or the like. The adhesive 116 may be applied to a back-side of the integrated circuit dies 114, such as to a back-side of the respective semiconductor wafer or may be applied over the surface of the carrier substrate 100. The integrated circuit dies 114 may be singulated, such as by sawing or dicing, and adhered to the dielectric layer 108 by the adhesive 116 using, for example, a pick-and-place tool.

Although two integrated circuit dies 114 are illustrated as being adhered in each of the first package region 600 and the second package region 602, it should be appreciated that more or less integrated circuit dies 114 may be adhered in each package region. For example, only one integrated circuit die 114 may be adhered in each region. Further, the integrated circuit dies 114 may vary in size. In some embodiments, the integrated circuit die 114 may be dies with a large footprint, such as system-on-chip (SoC) devices. In embodiments where the integrated circuit die 114 have a large footprint, the space available for the through vias 112 in the package regions may be limited. Use of the back-side redistribution structure 110 allows for an improved interconnect arrangement when the package regions have limited space available for the for the through vias 112.

Figure 5:
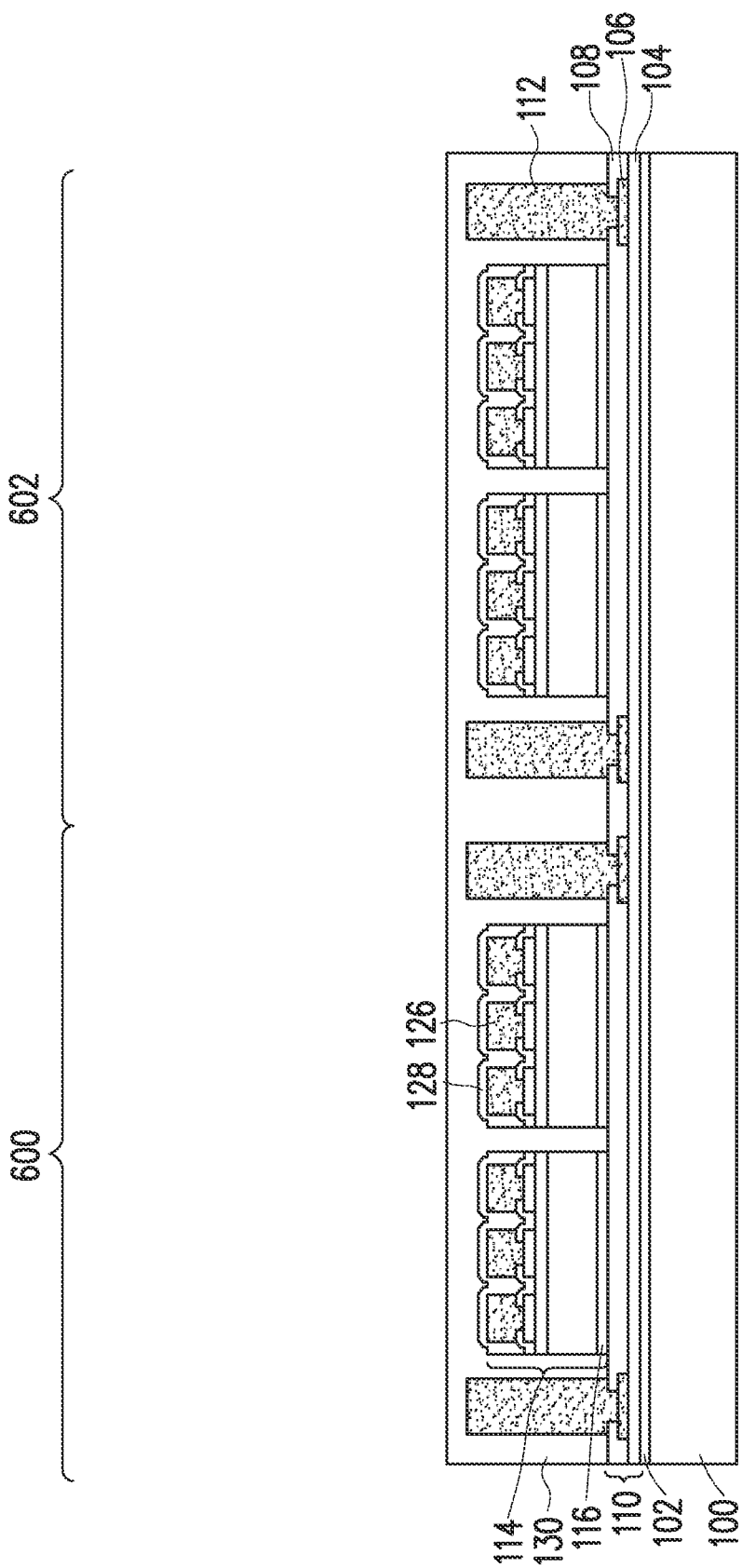

In FIG. 5, an encapsulant 130 is formed on the various components. The encapsulant 130 may be a molding compound, epoxy, or the like, and may be applied by compression molding, transfer molding, or the like. The encapsulant 130 may be formed over the carrier substrate 100 such that the through vias 112 and/or the die connectors 126 of the integrated circuit dies 114 are buried or covered. The encapsulant 130 is then cured.

Figure 6:
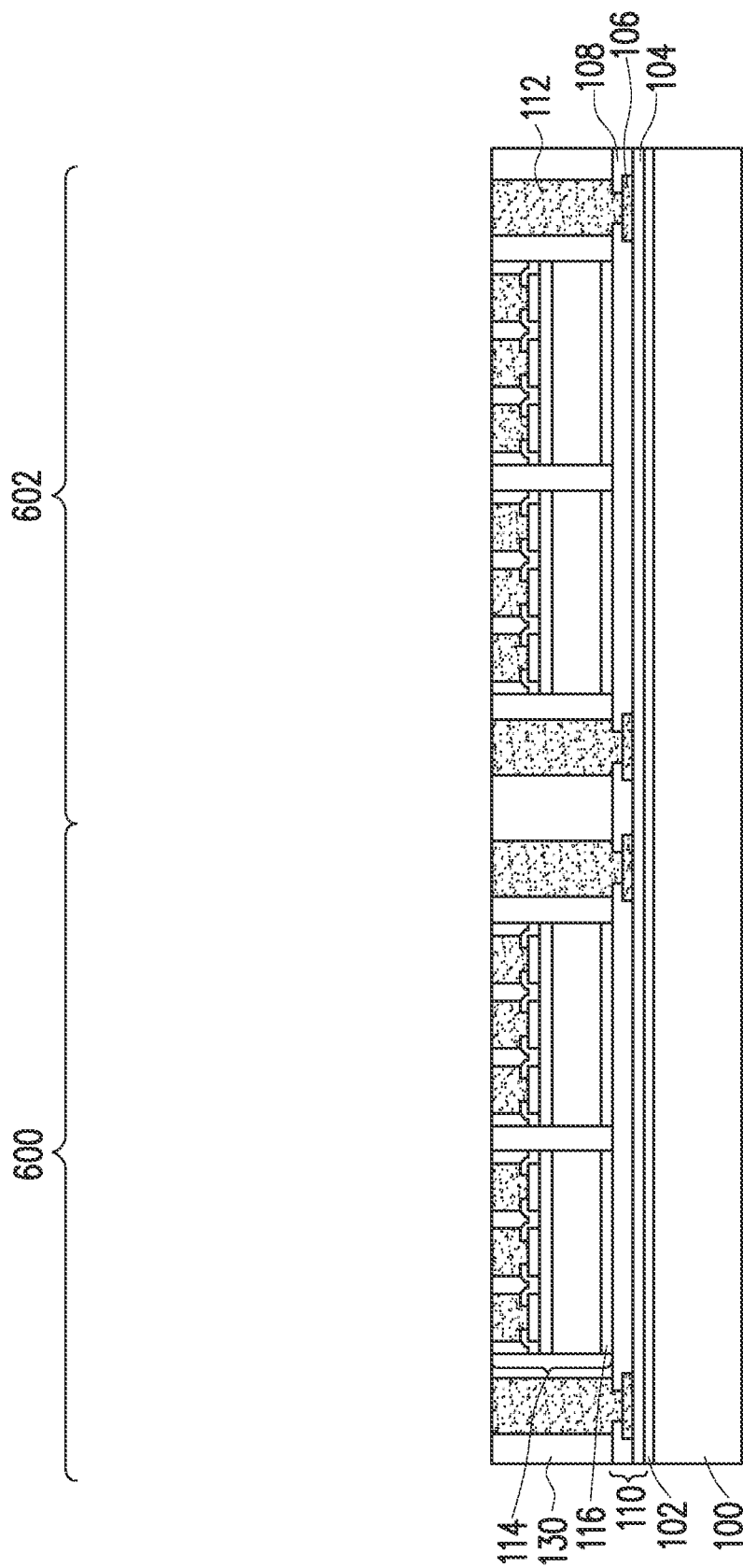

In FIG. 6, a planarization process is performed on the encapsulant 130 to expose the through vias 112 and the die connectors 126. The planarization process may also grind the dielectric material 128. Top surfaces of the through vias 112, die connectors 126, dielectric material 128, and encapsulant 130 are coplanar after the planarization process. The planarization process may be, for example, a chemical-mechanical polish (CMP), a grinding process, or the like. In some embodiments, the planarization may be omitted, for example, if the through vias 112 and die connectors 126 are already exposed.

In FIGS. 7 through 14, a front-side redistribution structure 132 is formed. As will be illustrated, the front-side redistribution structure 132 includes dielectric layers 134, 140, 146, and 152, and also includes metallization patterns 138, 144, and 150. The metallization patterns may also be referred to as redistribution layers or redistribution lines, and include conductive vias and conductive lines (not separately labeled).

Figure 7:
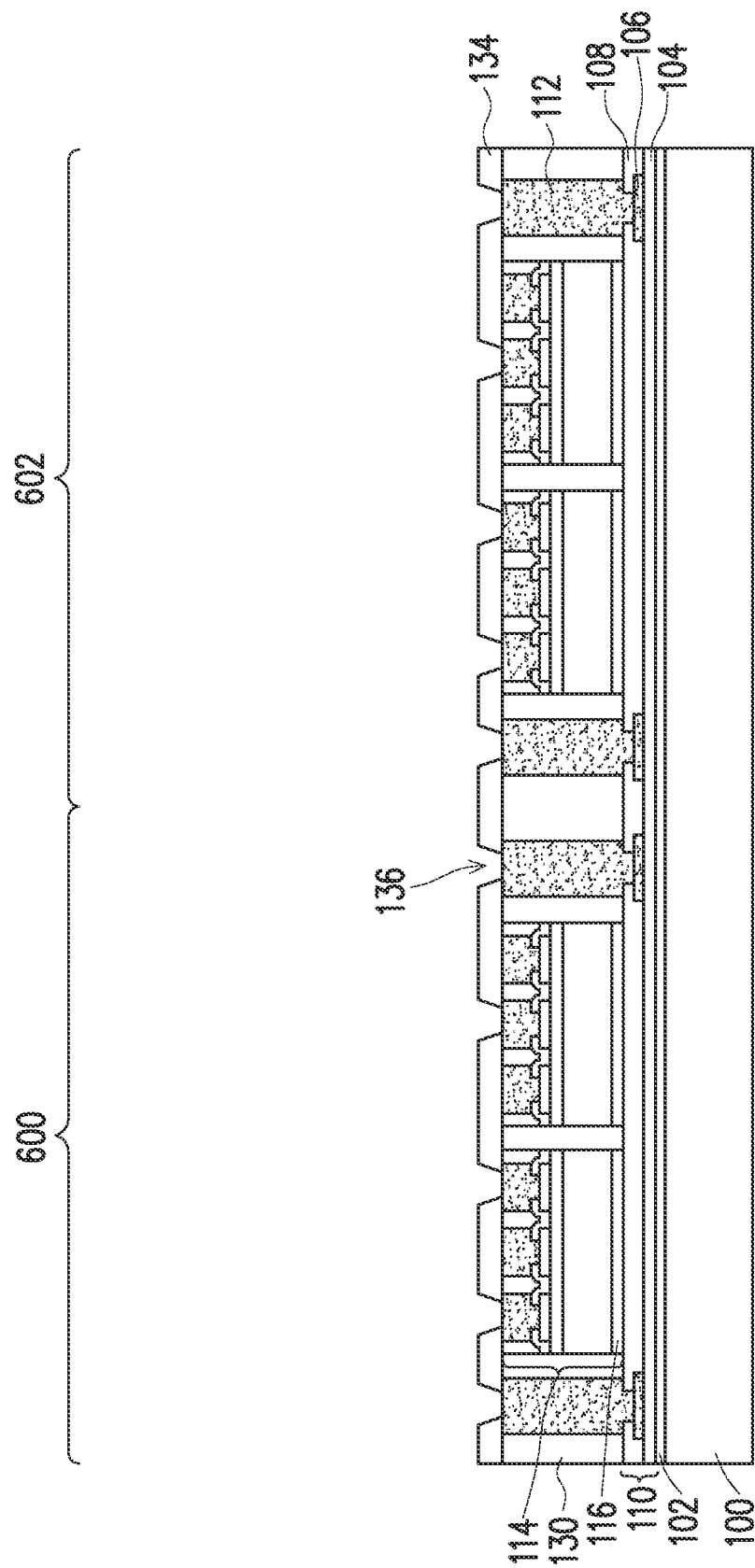

In FIG. 7, the dielectric layer 134 is deposited on the encapsulant 130, through vias 112, and die connectors 126. In some embodiments, the dielectric layer 134 is formed of a polymer, which may be a photo-sensitive material such as PBO, polyimide, BCB, or the like, that may be patterned using a lithography mask. In other embodiments, the dielectric layer 134 is formed of a nitride such as silicon nitride; an oxide such as silicon oxide, PSG, BSG, BPSG; or the like. The dielectric layer 134 may be formed by spin coating, lamination, CVD, the like, or a combination thereof.

The dielectric layer 134 is then patterned. The patterning forms openings 136 to expose portions of the through vias 112 and the die connectors 126. The patterning may be by an acceptable process, such as by exposing the dielectric layer 134 to light when the dielectric layer 134 is a photo-sensitive material or by etching using, for example, an anisotropic etch. If the dielectric layer 134 is a photo-sensitive material, the dielectric layer 134 can be developed after the exposure.

Figure 8:
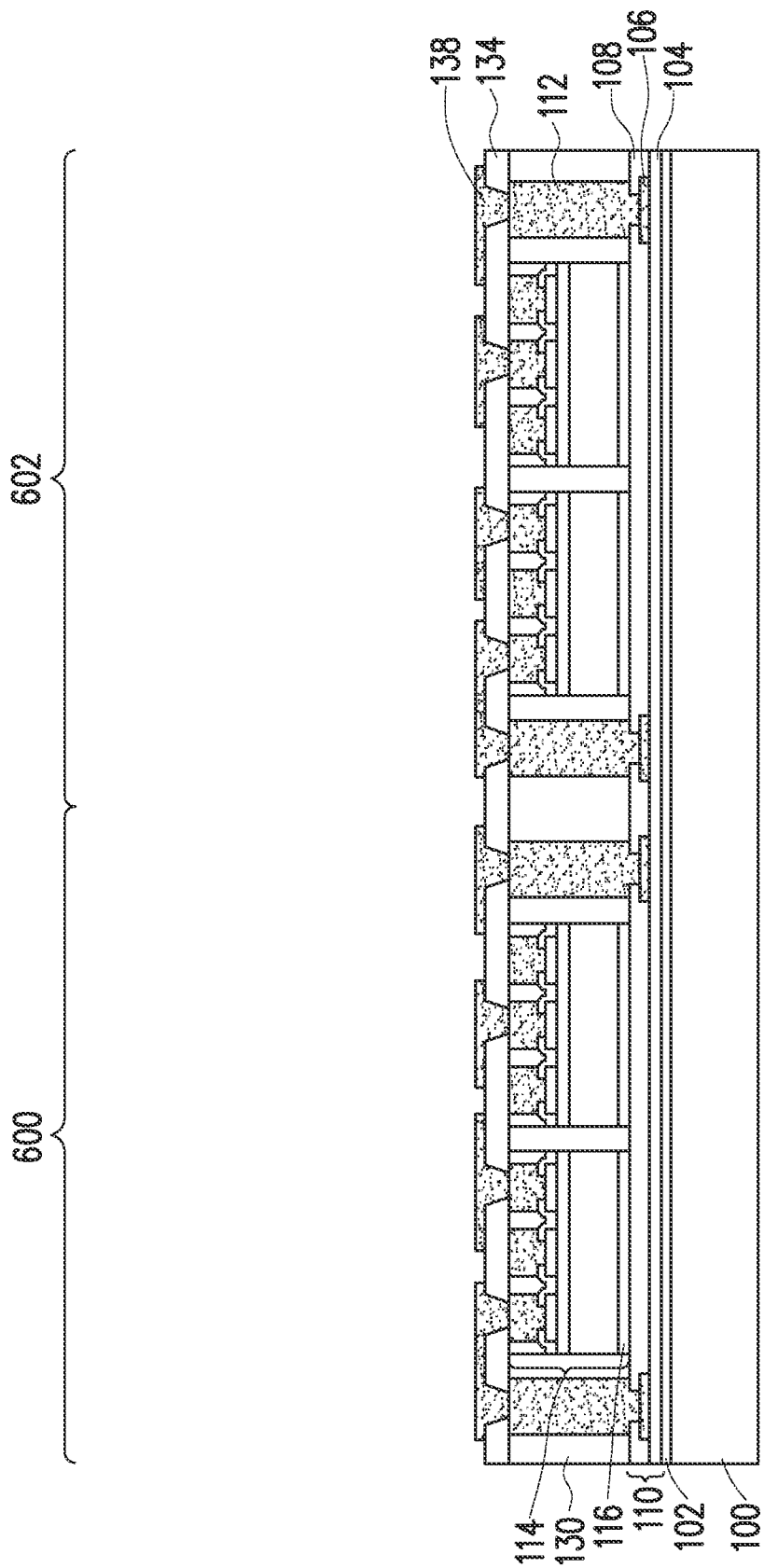

In FIG. 8, the metallization pattern 138 with vias is formed on the dielectric layer 134. As an example to form the metallization pattern 138, a seed layer (not shown) is formed over the dielectric layer 134 and in the openings 136 through the dielectric layer 134. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, PVD or the like. A photo resist is then formed and patterned on the seed layer. The photo resist may be formed by spin coating or the like and may be exposed to light for patterning. The pattern of the photo resist corresponds to the metallization pattern 138. The patterning forms openings through the photo resist to expose the seed layer. A conductive material is formed in the openings of the photo resist and on the exposed portions of the seed layer. The conductive material may be formed by plating, such as electroplating or electroless plating, or the like. The conductive material may comprise a metal, like copper, titanium, tungsten, aluminum, or the like. Then, the photo resist and portions of the seed layer on which the conductive material is not formed are removed. The photo resist may be removed by an acceptable ashing or stripping process, such as using an oxygen plasma or the like. Once the photo resist is removed, exposed portions of the seed layer are removed, such as by using an acceptable etching process, such as by wet or dry etching. The remaining portions of the seed layer and conductive material form the metallization pattern 138 and vias. The vias are formed in openings 136 through the dielectric layer 134 to, e.g., the through vias 112 and/or the die connectors 126.

Figure 9:
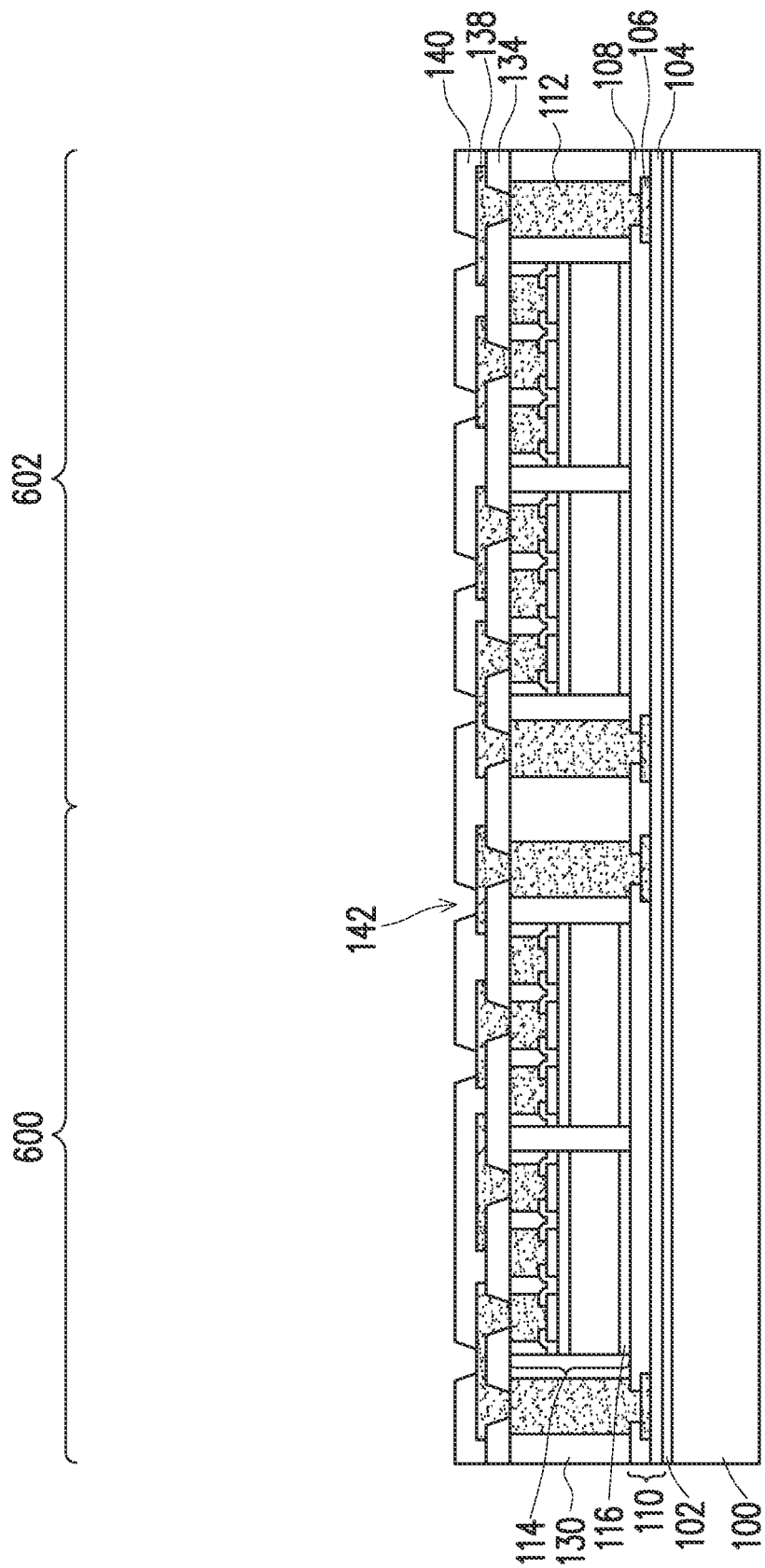

In FIG. 9, the dielectric layer 140 is deposited on the metallization pattern 138 and the dielectric layer 134. In some embodiments, the dielectric layer 140 is formed of a polymer, which may be a photo-sensitive material such as PBO, polyimide, BCB, or the like, that may be patterned using a lithography mask. In other embodiments, the dielectric layer 140 is formed of a nitride such as silicon nitride; an oxide such as silicon oxide, PSG, BSG, BPSG; or the like. The dielectric layer 140 may be formed by spin coating, lamination, CVD, the like, or a combination thereof.

The dielectric layer 140 is then patterned. The patterning forms openings 142 to expose portions of the metallization pattern 138. The patterning may be by an acceptable process, such as by exposing the dielectric layer 140 to light when the dielectric layer 140 is a photo-sensitive material or by etching using, for example, an anisotropic etch. If the dielectric layer 140 is a photo-sensitive material, the dielectric layer 140 can be developed after the exposure.

Figure 10:
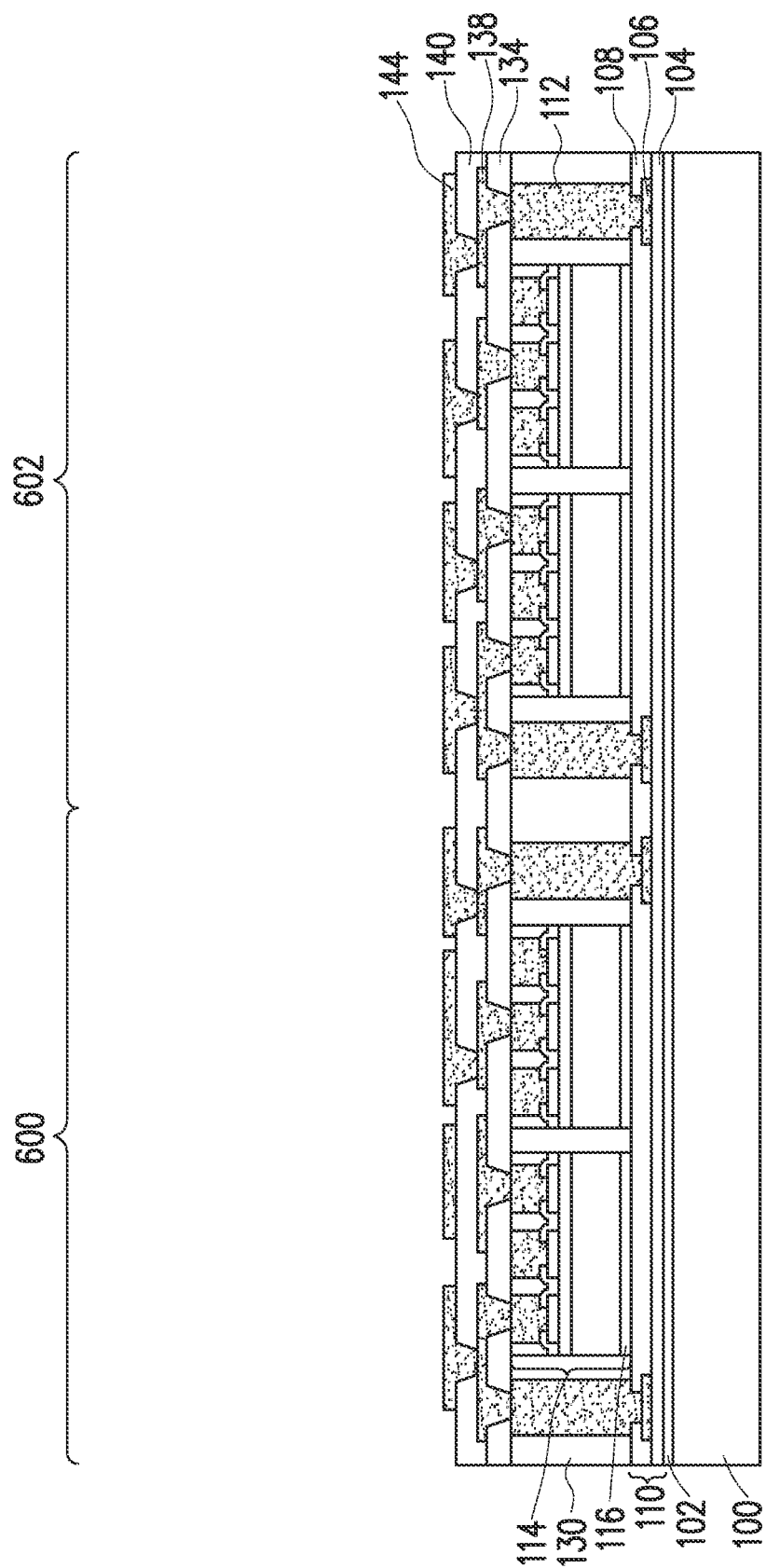

In FIG. 10, the metallization pattern 144 with vias is formed on the dielectric layer 140. As an example to form the metallization pattern 144, a seed layer (not shown) is formed over the dielectric layer 140 and in the openings 142 through the dielectric layer 140. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, PVD or the like. A photo resist is then formed and patterned on the seed layer. The photo resist may be formed by spin coating or the like and may be exposed to light for patterning. The pattern of the photo resist corresponds to the metallization pattern 144. The patterning forms openings through the photo resist to expose the seed layer. A conductive material is formed in the openings of the photo resist and on the exposed portions of the seed layer. The conductive material may be formed by plating, such as electroplating or electroless plating, or the like. The conductive material may comprise a metal, like copper, titanium, tungsten, aluminum, or the like. Then, the photo resist and portions of the seed layer on which the conductive material is not formed are removed. The photo resist may be removed by an acceptable ashing or stripping process, such as using an oxygen plasma or the like. Once the photo resist is removed, exposed portions of the seed layer are removed, such as by using an acceptable etching process, such as by wet or dry etching. The remaining portions of the seed layer and conductive material form the metallization pattern 144 and vias. The vias are formed in the openings 142 through the dielectric layer 140 to, e.g., portions of the metallization pattern 138.

Figure 11:
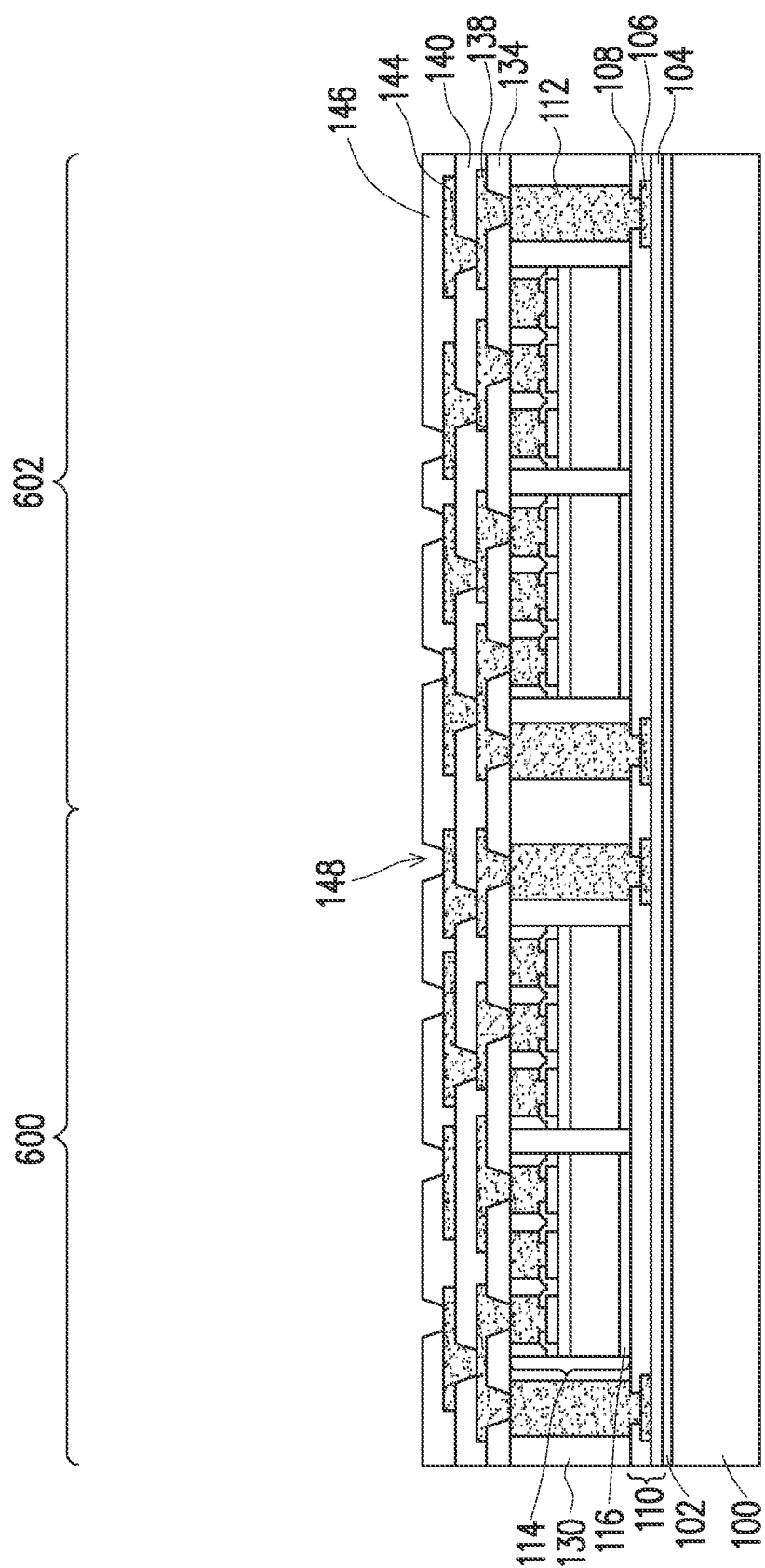

In FIG. 11, the dielectric layer 146 is deposited on the metallization pattern 144 and the dielectric layer 140. In some embodiments, the dielectric layer 146 is formed of a polymer, which may be a photo-sensitive material such as PBO, polyimide, BCB, or the like, that may be patterned using a lithography mask. In other embodiments, the dielectric layer 146 is formed of a nitride such as silicon nitride; an oxide such as silicon oxide, PSG, BSG, BPSG; or the like. The dielectric layer 146 may be formed by spin coating, lamination, CVD, the like, or a combination thereof.

The dielectric layer 146 is then patterned. The patterning forms openings 148 to expose portions of the metallization pattern 144. The patterning may be by an acceptable process, such as by exposing the dielectric layer 146 to light when the dielectric layer 146 is a photo-sensitive material or by etching using, for example, an anisotropic etch. If the dielectric layer 146 is a photo-sensitive material, the dielectric layer 146 can be developed after the exposure.

Figure 12:
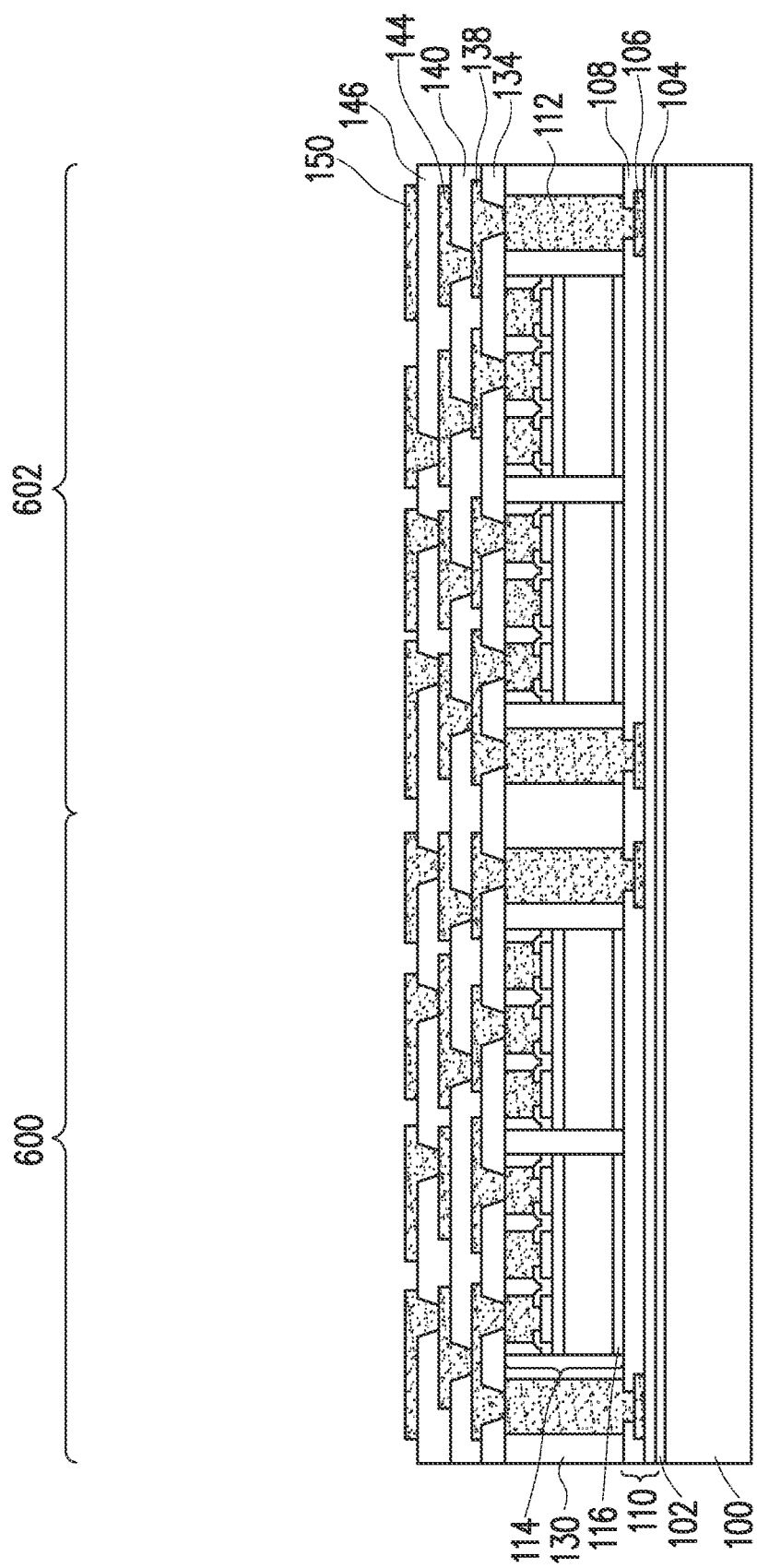

In FIG. 12, the metallization pattern 150 with vias is formed on the dielectric layer 146. As an example to form metallization pattern 150, a seed layer (not shown) is formed over the dielectric layer 146 and in the openings 148 through the dielectric layer 146. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, PVD or the like. A photo resist is then formed and patterned on the seed layer. The photo resist may be formed by spin coating or the like and may be exposed to light for patterning. The pattern of the photo resist corresponds to the metallization pattern 150. The patterning forms openings through the photo resist to expose the seed layer. A conductive material is formed in the openings of the photo resist and on the exposed portions of the seed layer. The conductive material may be formed by plating, such as electroplating or electroless plating, or the like. The conductive material may comprise a metal, like copper, titanium, tungsten, aluminum, or the like. Then, the photo resist and portions of the seed layer on which the conductive material is not formed are removed. The photo resist may be removed by an acceptable ashing or stripping process, such as using an oxygen plasma or the like. Once the photo resist is removed, exposed portions of the seed layer are removed, such as by using an acceptable etching process, such as by wet or dry etching. The remaining portions of the seed layer and conductive material form the metallization pattern 150 and vias. The vias are formed in openings through the dielectric layer 146 to, e.g., portions of the metallization pattern 144.

Figure 13:
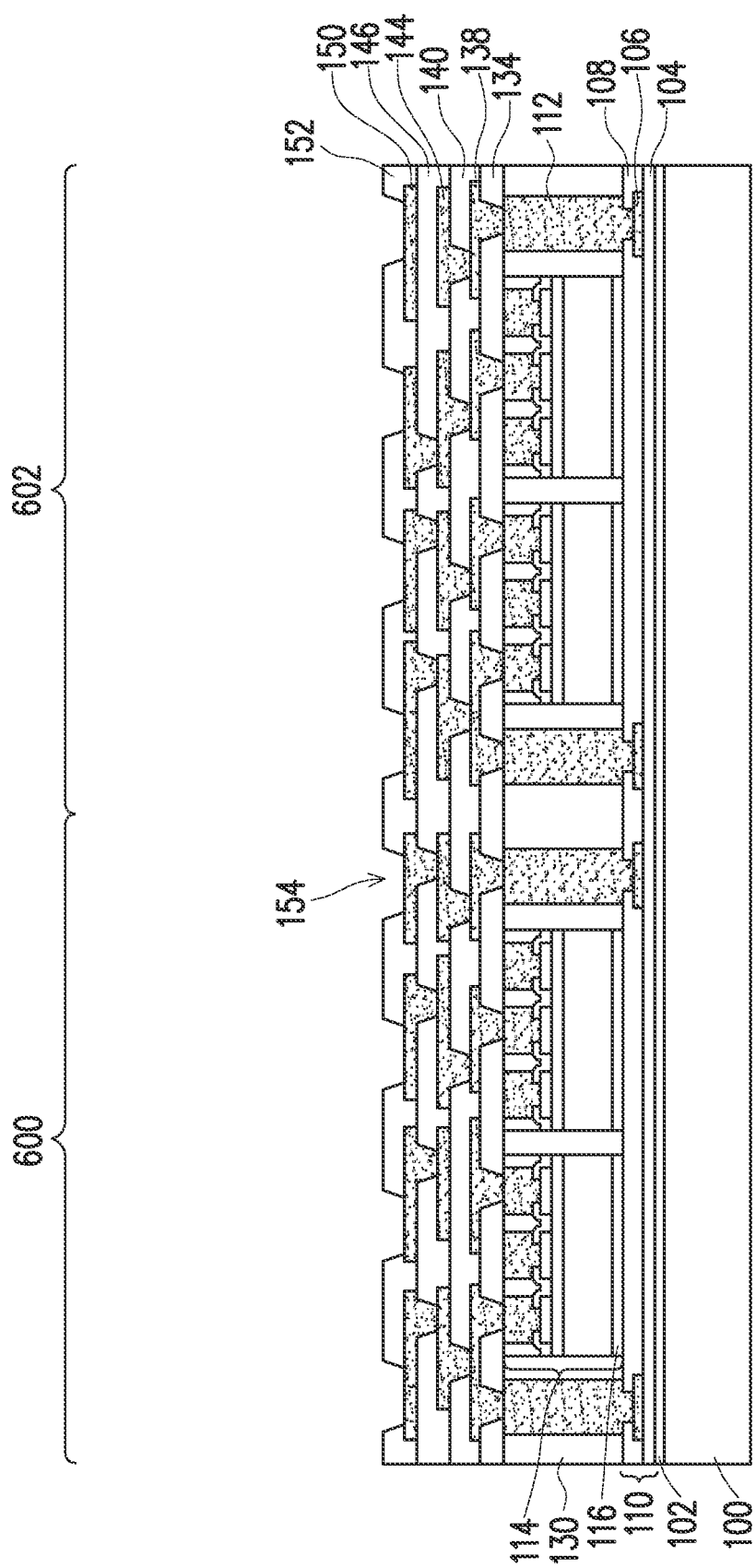

In FIG. 13, the dielectric layer 152 is deposited on the metallization pattern 150 and the dielectric layer 146. In some embodiments, the dielectric layer 152 is formed of a polymer, which may be a photo-sensitive material such as PBO, polyimide, BCB, or the like, that may be patterned using a lithography mask. In other embodiments, the dielectric layer 152 is formed of a nitride such as silicon nitride; an oxide such as silicon oxide, PSG, BSG, BPSG; or the like. The dielectric layer 152 may be formed by spin coating, lamination, CVD, the like, or a combination thereof.

The dielectric layer 152 is then patterned. The patterning forms openings 154 to expose portions of the metallization pattern 150. The patterning may be by an acceptable process, such as by exposing the dielectric layer 152 to light when the dielectric layer 152 is a photo-sensitive material or by etching using, for example, an anisotropic etch. If the dielectric layer 152 is a photo-sensitive material, the dielectric layer 152 can be developed after the exposure. The openings 154 may be wider than the openings 136, 142, 148.

Figure 14:
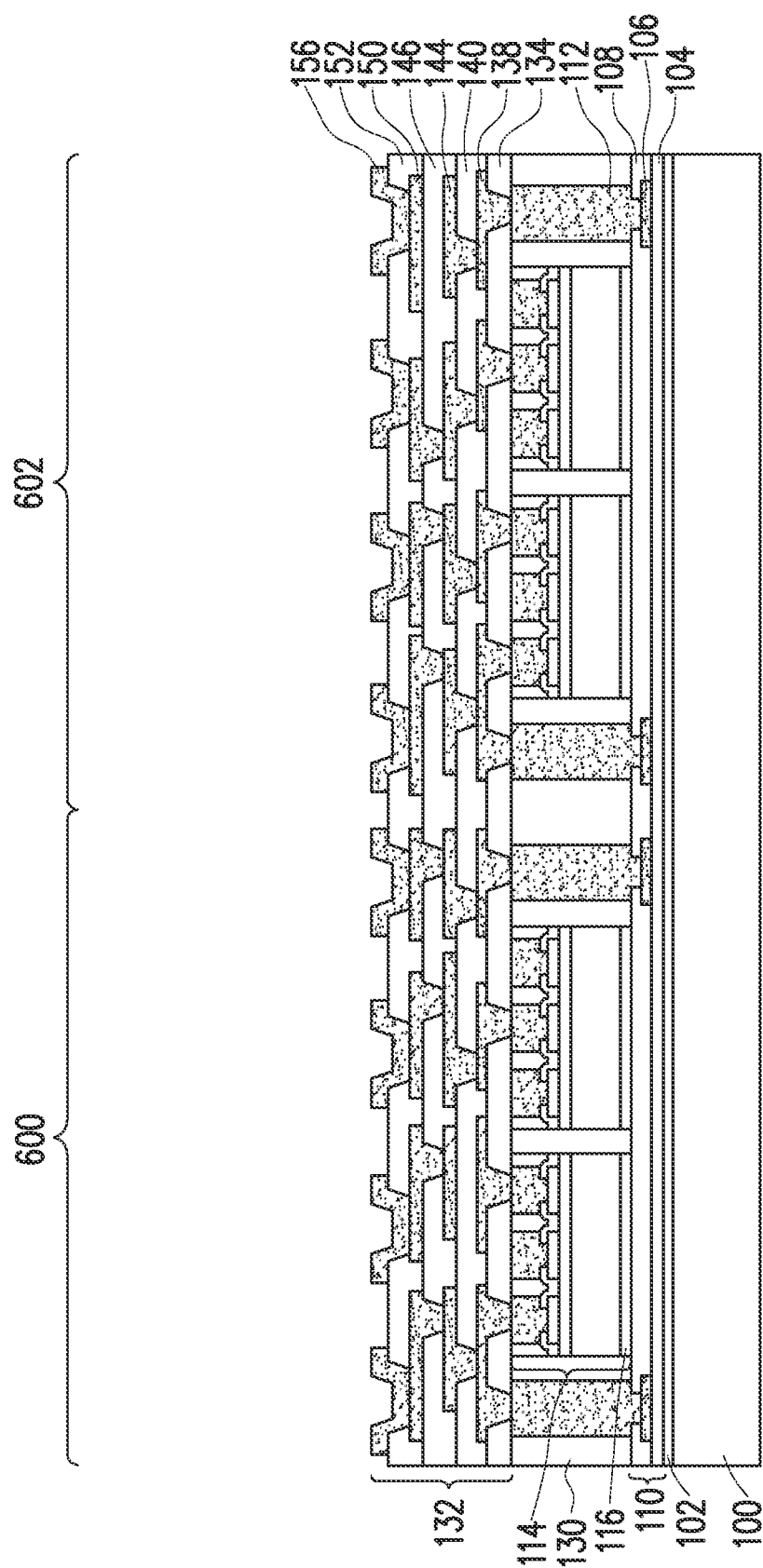

In FIG. 14, under bump metallurgies (UBMs) 156 are formed on the dielectric layer 152. In the illustrated embodiment, the UBMs 156 are formed through the openings 154 through the dielectric layer 152 to the metallization pattern 150. As an example to form the UBMs 156, a seed layer (not shown) is formed over the dielectric layer 152. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, PVD or the like. A photo resist is then formed and patterned on the seed layer. The photo resist may be formed by spin coating or the like and may be exposed to light for patterning. The pattern of the photo resist corresponds to the UBMs 156. The patterning forms openings through the photo resist to expose the seed layer. A conductive material is formed in the openings of the photo resist and on the exposed portions of the seed layer. The conductive material may be formed by plating, such as electroplating or electroless plating, or the like. The conductive material may comprise a metal, like copper, titanium, tungsten, aluminum, or the like. Then, the photo resist and portions of the seed layer on which the conductive material is not formed are removed. The photo resist may be removed by an acceptable ashing or stripping process, such as using an oxygen plasma or the like. Once the photo resist is removed, exposed portions of the seed layer are removed, such as by using an acceptable etching process, such as by wet or dry etching. The remaining portions of the seed layer and conductive material form the UBMs 156. In embodiments where the UBMs 156 are formed differently, more photo resist and patterning steps may be utilized.

The front-side redistribution structure 132 is shown as an example. More or fewer dielectric layers and metallization patterns may be formed in the front-side redistribution structure 132. If fewer dielectric layers and metallization patterns are to be formed, steps and process discussed above may be omitted. If more dielectric layers and metallization patterns are to be formed, steps and processes discussed above may be repeated. One having ordinary skill in the art will readily understand which steps and processes would be omitted or repeated.

Figure 15:
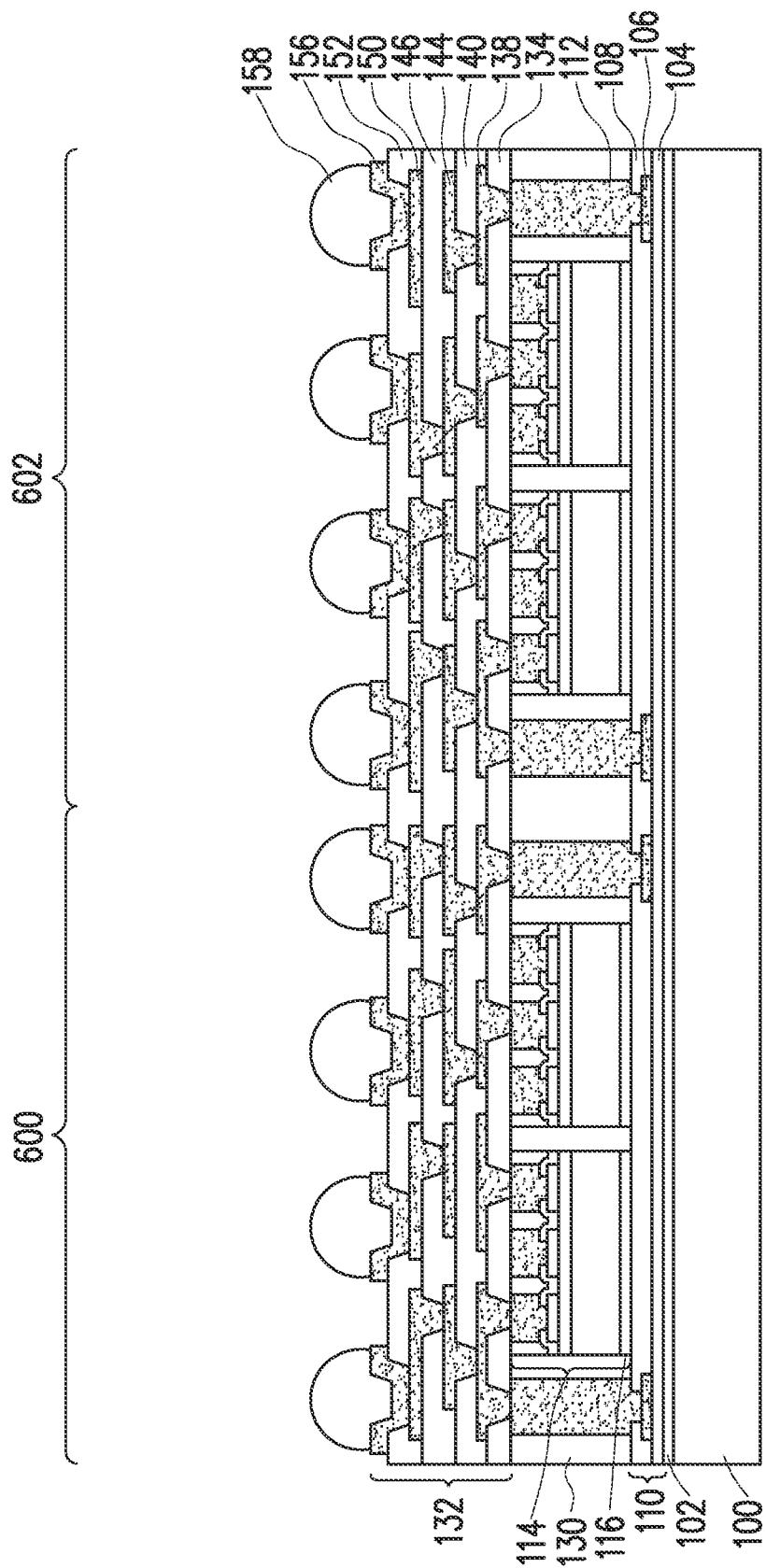

In FIG. 15, conductive connectors 158 are formed on the UBMs 156. The conductive connectors 158 may be BGA connectors, solder balls, metal pillars, controlled collapse chip connection (C4) bumps, micro bumps, electroless nickel-electroless palladium-immersion gold technique (ENEPIG) formed bumps, or the like. The conductive connectors 158 may include a conductive material such as solder, copper, aluminum, gold, nickel, silver, palladium, tin, the like, or a combination thereof. In some embodiments, the conductive connectors 158 are formed by initially forming a layer of solder through such commonly used methods such as evaporation, electroplating, printing, solder transfer, ball placement, or the like. Once a layer of solder has been formed on the structure, a reflow may be performed in order to shape the material into the desired bump shapes. In another embodiment, the conductive connectors 158 are metal pillars (such as a copper pillar) formed by a sputtering, printing, electro plating, electroless plating, CVD, or the like. The metal pillars may be solder free and have substantially vertical sidewalls. In some embodiments, a metal cap layer (not shown) is formed on the top of the metal pillars. The metal cap layer may include nickel, tin, tin-lead, gold, silver, palladium, indium, nickel-palladium-gold, nickel-gold, the like, or a combination thereof and may be formed by a plating process.

Figure 16:
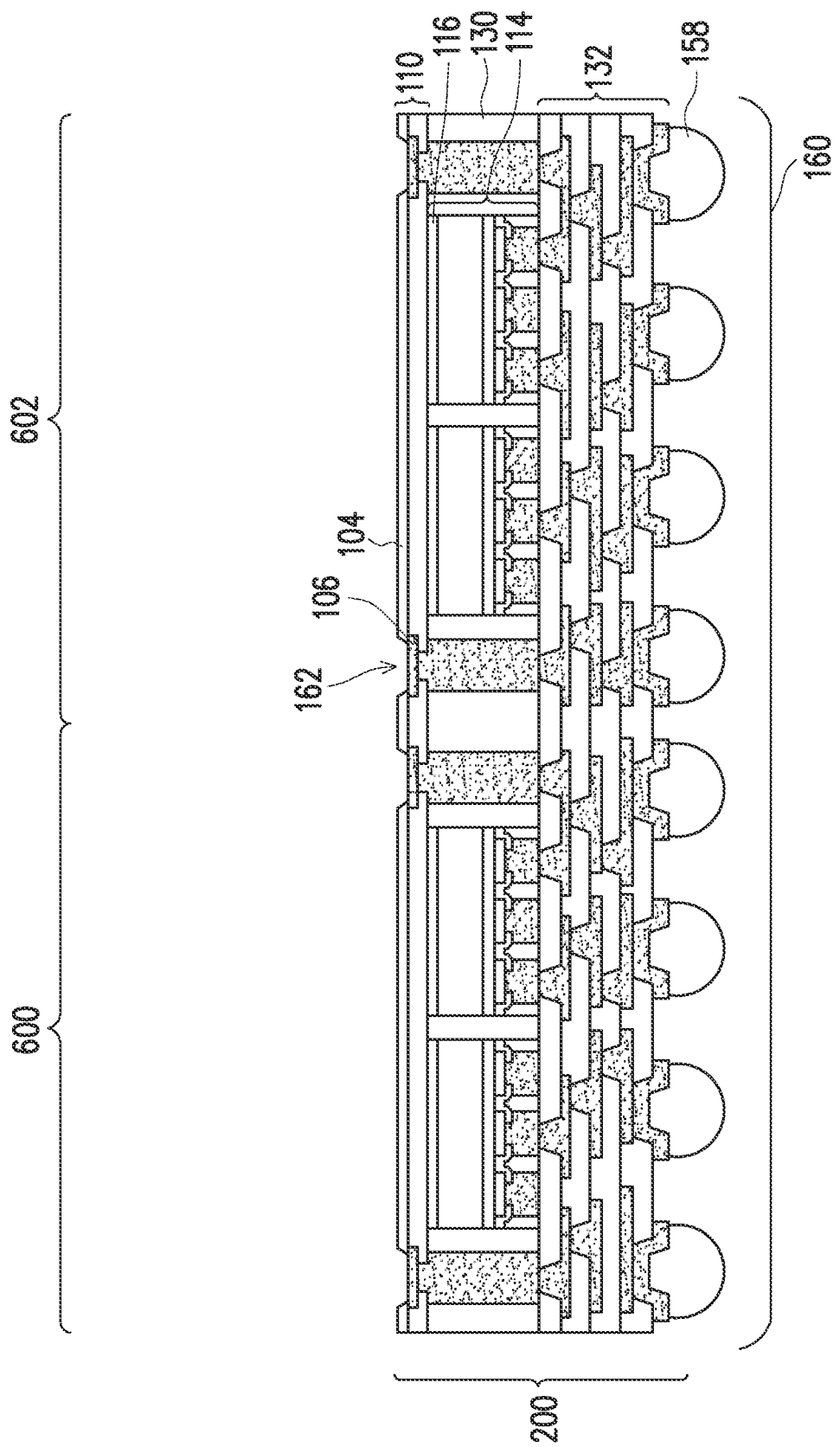

In FIG. 16, a carrier substrate de-bonding is performed to detach (de-bond) the carrier substrate 100 from the back-side redistribution structure 110, e.g., the dielectric layer 104. The first packages 200 are thereby formed in each of the first package region 600 and the second package region 602. In accordance with some embodiments, the de-bonding includes projecting a light such as a laser light or an UV light on the release layer 102 so that the release layer 102 decomposes under the heat of the light and the carrier substrate 100 can be removed. The structure is then flipped over and placed on a tape 160. Further, openings 162 are formed through the dielectric layer 104 to expose portions of the metallization pattern 106. The openings 162 may be formed, for example, using laser drilling, etching, or the like.

FIGS. 17 through 20 illustrate cross-sectional views of intermediate steps during a process for forming a package structure 500, in accordance with some embodiments. The package structure 500 may be referred to a package-on-package (PoP) structure.

Figure 17:
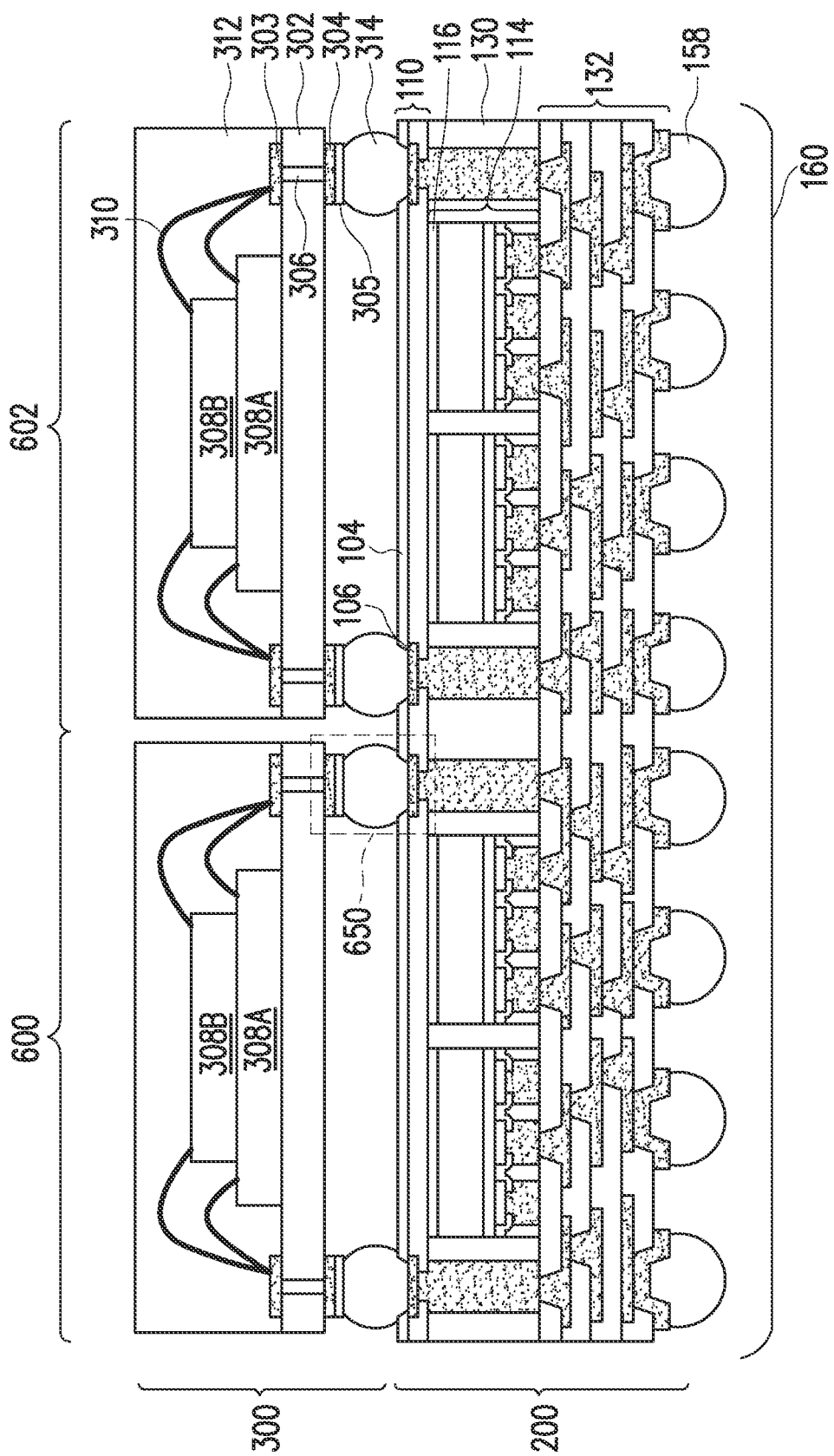
FIGS. 17, 18A, 18B, 18C, 19, and 20 illustrate cross-sectional views of intermediate steps during a process for forming a package structure, in accordance with some embodiments.

In FIG. 17, a second package 300 is attached to the first package 200. The second package 300 includes a substrate 302 and one or more stacked dies 308 (308A and 308B) coupled to the substrate 302. Although a singular stack of dies 308 (308A and 308B) is illustrated, in other embodiments, a plurality of stacked dies 308 (each having one or more stacked dies) may be disposed side by side coupled to a same surface of the substrate 302. The substrate 302 may be made of a semiconductor material such as silicon, germanium, diamond, or the like. In some embodiments, compound materials such as silicon germanium, silicon carbide, gallium arsenic, indium arsenide, indium phosphide, silicon germanium carbide, gallium arsenic phosphide, gallium indium phosphide, combinations of these, and the like, may also be used. Additionally, the substrate 302 may be a silicon-on-insulator (SOI) substrate. Generally, an SOI substrate includes a layer of a semiconductor material such as epitaxial silicon, germanium, silicon germanium, SOI, silicon germanium on insulator (SGOI), or combinations thereof. The substrate 302 is, in one alternative embodiment, based on an insulating core such as a fiberglass reinforced resin core. One example core material is fiberglass resin such as FR4. Alternatives for the core material include bismaleimide-triazine (BT) resin, or alternatively, other printed circuit board (PCB) materials or films. Build up films such as Ajinomoto build-up film (ABF) or other laminates may be used for substrate 302.

The substrate 302 may include active and passive devices (not shown). As one of ordinary skill in the art will recognize, a wide variety of devices such as transistors, capacitors, resistors, combinations of these, and the like may be used to generate the structural and functional requirements of the design for the second package 300. The devices may be formed using any suitable methods.

The substrate 302 may also include metallization layers (not shown) and through vias 306. The metallization layers may be formed over the active and passive devices and are designed to connect the various devices to form functional circuitry. The metallization layers may be formed of alternating layers of dielectric (e.g., low-k dielectric material) and conductive material (e.g., copper) with vias interconnecting the layers of conductive material and may be formed through any suitable process (such as deposition, damascene, dual damascene, or the like). In some embodiments, the substrate 302 is substantially free of active and passive devices.

The substrate 302 may have bond pads 303 on a first side the substrate 202 to couple to the stacked dies 308, and bond pads 304 on a second side of the substrate 302, the second side being opposite the first side of the substrate 302, to couple to the conductive connectors 314. In some embodiments, the bond pads 303 and 304 are formed by forming recesses (not shown) into dielectric layers (not shown) on the first and second sides of the substrate 302. The recesses may be formed to allow the bond pads 303 and 304 to be embedded into the dielectric layers. In other embodiments, the recesses are omitted as the bond pads 303 and 304 may be formed on the dielectric layer. In some embodiments, the bond pads 303 and 304 include a thin seed layer (not shown) made of copper, titanium, nickel, gold, palladium, the like, or a combination thereof. The conductive material of the bond pads 303 and 304 may be deposited over the thin seed layer. The conductive material may be formed by an electrochemical plating process, an electroless plating process, CVD, ALD, PVD, the like, or a combination thereof. In an embodiment, the conductive material of the bond pads 303 and 304 is copper, tungsten, aluminum, silver, gold, the like, or a combination thereof.

In an embodiment, the bond pads 303 and 304 are UBMs that include three layers of conductive materials, such as a layer of titanium, a layer of copper, and a layer of nickel. For example, the bond pads 304 may be formed from copper, may be formed on a layer of titanium (not shown), and have a nickel finish 305. The nickel finish 305 may improve the shelf life of the device package 300, which may be particularly advantageous when the device package 300 is a memory device such as a DRAM module. However, one of ordinary skill in the art will recognize that there are many suitable arrangements of materials and layers, such as an arrangement of chrome/chrome-copper alloy/copper/gold, an arrangement of titanium/titanium tungsten/copper, or an arrangement of copper/nickel/gold, that are suitable for the formation of the bond pads 303 and 304. Any suitable materials or layers of material that may be used for the bond pads 303 and 304 are fully intended to be included within the scope of the current application. In some embodiments, the through vias 306 extend through the substrate 302 and couple at least one bond pad 303 to at least one bond pad 304.

In the illustrated embodiment, the stacked dies 308 are coupled to the substrate 302 by wire bonds 310, although other connections may be used, such as conductive bumps. In an embodiment, the stacked dies 308 are stacked memory dies. For example, the stacked dies 308 may be memory dies such as low-power (LP) double data rate (DDR) memory modules, such as LPDDR1, LPDDR2, LPDDR3, LPDDR4, or the like memory modules. As noted above, in such embodiments, the bond pads 304 may have a nickel finish 305.

The stacked dies 308 and the wire bonds 310 may be encapsulated by a molding material 312. The molding material 312 may be molded on the stacked dies 308 and the wire bonds 310, for example, using compression molding. In some embodiments, the molding material 312 is a molding compound, a polymer, an epoxy, silicon oxide filler material, the like, or a combination thereof. A curing process may be performed to cure the molding material 312; the curing process may be a thermal curing, a UV curing, the like, or a combination thereof.

In some embodiments, the stacked dies 308 and the wire bonds 310 are buried in the molding material 312, and after the curing of the molding material 312, a planarization step, such as a grinding, is performed to remove excess portions of the molding material 312 and provide a substantially planar surface for the second package 300.

Figure 18A:
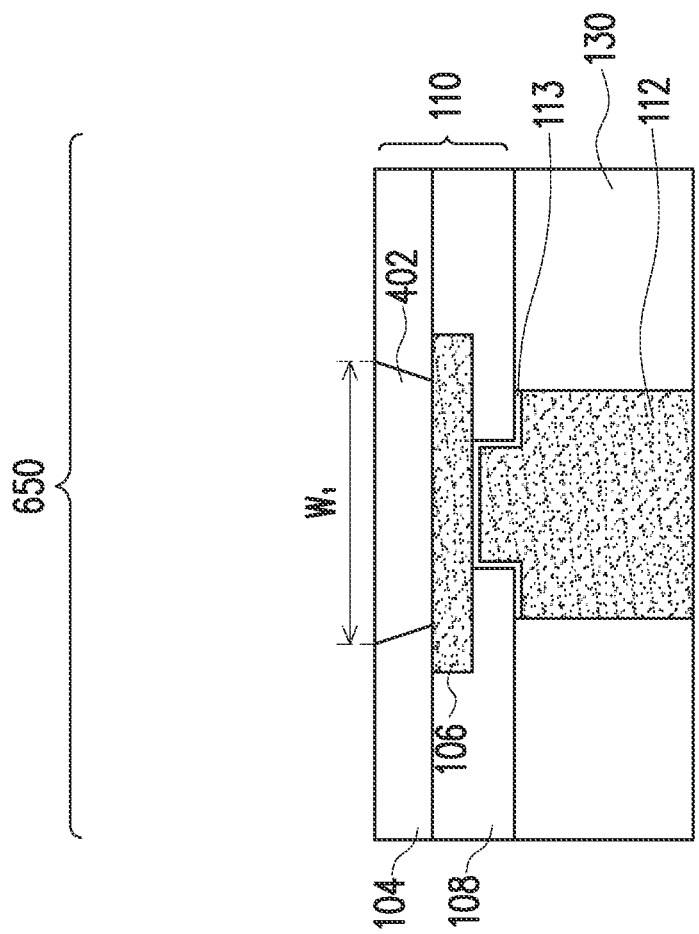
Figure 18B:
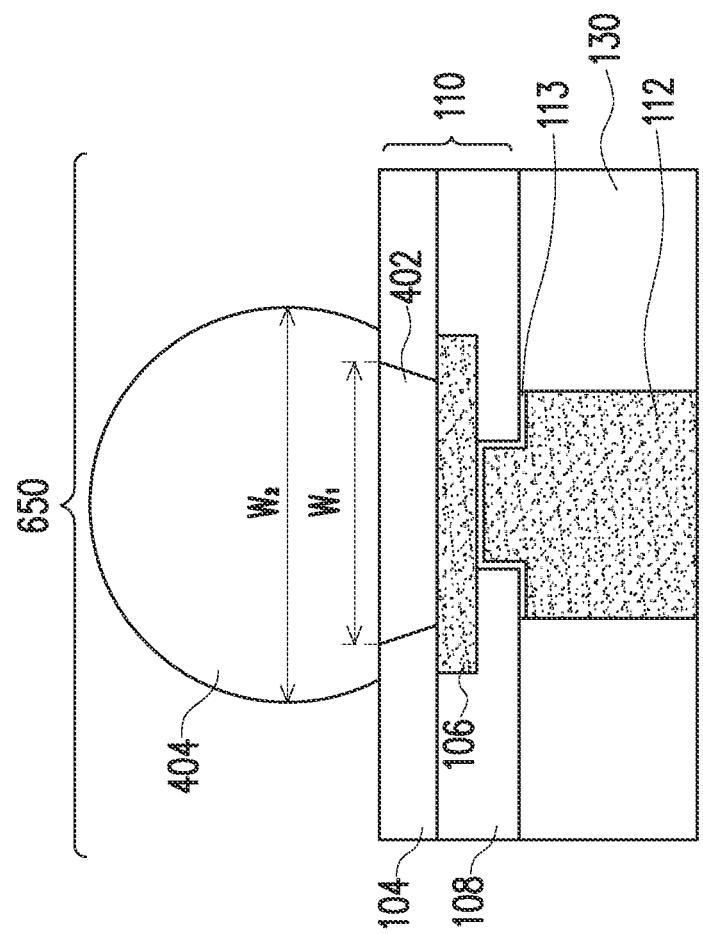
Figure 18C:
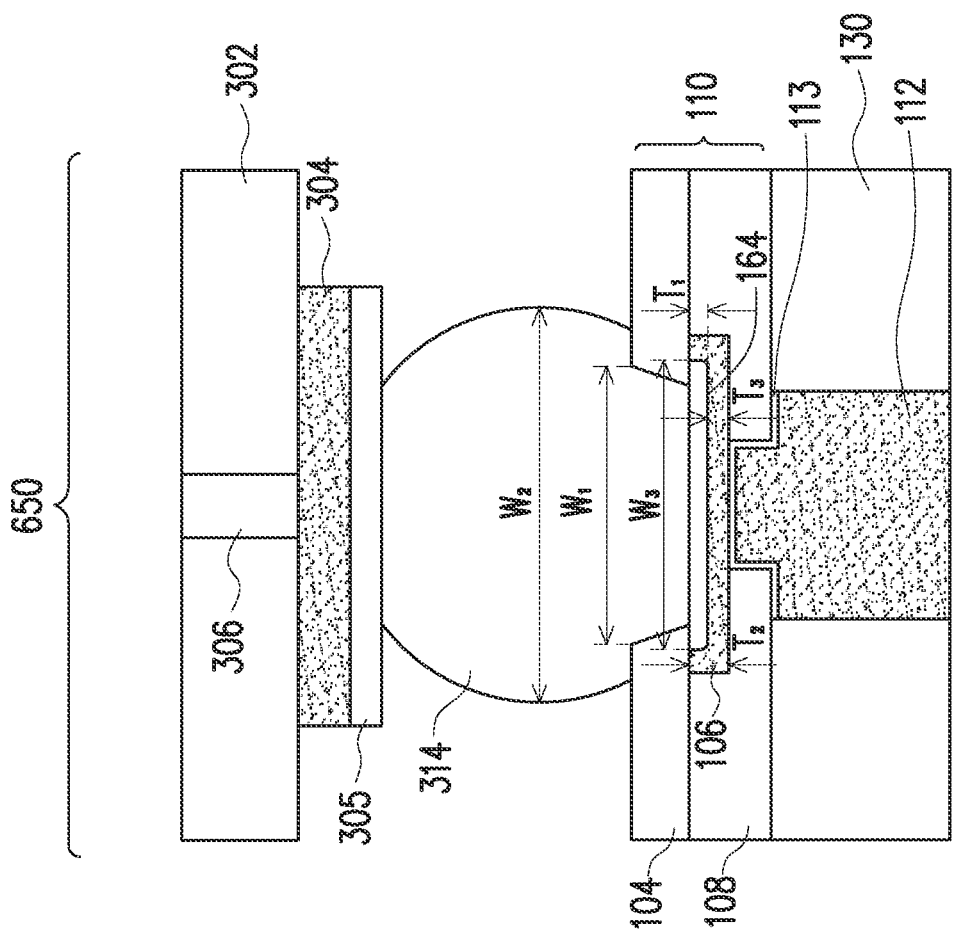

After the second package 300 is formed, the second package 300 is mechanically and electrically bonded to the first package 200 by way of conductive connectors 314, the bond pads 304, and the metallization pattern 106. In some embodiments, the stacked dies 308 may be coupled to the integrated circuit dies 114 through the wire bonds 310, the bond pads 303 and 304, through vias 306, the conductive connectors 314, and the through vias 112. FIGS. 18A through 18C are cross-sectional views illustrating more details of a region 650 during a process for bonding the first package 200 and second package 300 with the conductive connectors 314.

In FIG. 18A, a reflowable layer 402 is formed on each of the exposed metallization patterns 106 in the openings 162. The reflowable layer 402 may be a solder layer (sometimes known as a pre-solder layer), a solder paste, or the like. In an embodiment, the reflowable layer 402 is a Cu-containing pre-solder material such as SnCu, SnAgCu, the like, or combinations thereof, and may be printed onto the exposed metallization patterns 106, although other processes, such as electroplating or electroless plating, may be utilized. The Cu concentration of the reflowable layer 402 may be from about 5% to about 10%. In some embodiments, the reflowable layer 402 completely fills or overfills the openings 162, and in other embodiment, the reflowable layer 402 only partially fills the openings 162. The openings 162 are formed to a width $W_1$ of from about 230 µm to about 260 µm, such as about 250 µm. As such, portions of the reflowable layer 402 in each opening 162 also have the width $W_1$.

In FIG. 18B, reflowable connectors 404 are formed on the reflowable layer 402, over the back side of the back-side redistribution structure 110. The reflowable connectors 404 may be similar to the conductive connectors 158. For example, the reflowable connectors 404 may be formed by initially forming a layer of solder through such commonly used methods such as evaporation, electroplating, printing, solder transfer, ball placement, or the like. Once a layer of solder has been formed on the structure, a reflow may be performed in order to shape the material into the desired bump shapes. The reflowable connectors 404 contain substantially no Cu or very little Cu. In particular, the Cu concentration of the reflowable layer 402 is greater than the Cu concentration of the reflowable connectors 404. After formation, the reflowable connectors 404 have a width $W_2$ of from about 250 µm to about 320 µm, such as about 300 µm.

In some embodiments, after formation, the reflowable connectors 404 are coated with a flux (not shown), such as a no-clean flux. The reflowable connectors 404 may be dipped in the flux or the flux may be jetted onto the reflowable connectors 404. In another embodiment, the flux may be applied to the surfaces of the metallization pattern 106.

In FIG. 18C, a reflow process is performed to bond the second package 300 to the first package 200 by, e.g., solder bonding. During this reflow process, the reflowable layer 402 and reflowable connectors 404 reflow to form the conductive connectors 314. After the reflow process, the reflow able layer 402 and reflowable connectors 404 may intermix and not be distinctly visible as separate structures. During this reflow process, the conductive connectors 314 are in contact with the bond pads 304 and the metallization pattern 106 to physically and electrically couple the second package 300 to the first package 200. The conductive connectors 314 may be disposed on an opposing side of the substrate 302 as the stacked dies 308, in the openings 162. After the bonding process, an intermetallic compound (IMC) (not shown) may form at the interface between the conductive connectors 314 and the bond pads 304. An IMC 164 also forms at the interface of the metallization pattern 106 and the conductive connectors 314. After formation, each IMC 164 has a width $W_3$ of from about 245 µm to about 275 µm, such as about 255 µm. The width $W_3$ of the IMCs 164 is less than the width $W_2$ of the conductive connectors 314, and may be greater than the width $W_1$ of the openings 162.

In embodiments where the nickel finish 305 is formed on the bond pads 304, the reflow process results in more Cu being consumed from the metallization pattern 106 during formation of the IMC 164. Further, substantially no Cu is consumed from the bond pads 304 due to the nickel finish 305 acting as a blocking layer. As such, according to Fick's law, the conductive connectors 314 have a graded concentration of Cu in embodiments where the nickel finish 305 is formed. In particular, the concentration of the Cu may decrease through the conductive connectors 314 in a direction extending from the metallization pattern 106 to the nickel finish 305.

The IMC 164 is formed to a thickness $T_1$, and the metallization pattern 106 of the back-side redistribution structure 110 is formed to a thickness $T_2$. As noted above, the openings 162 are formed to a width $W_1$, and the reflowable connectors 404 are formed to a width $W_2$. The process conditions of forming the openings 162 and reflowable connectors 404 are controlled such that the ratio of the width $W_2$ to the width $W_1$ is within a particular range. Controlling the ratio of the width $W_2$ to the width $W_1$ allows the thickness $T_1$ of the IMC 164 to be controlled. Notably, the ratio of the width $W_2$ to the width $W_1$ is controlled such that the thickness $T_1$ is less than the thickness $T_2$ by a difference of thickness $T_3$. In an embodiment, the thickness $T_2$ of the metallization pattern 106 may be from about 6 μm to about 10 μm, such as about 7 μm. In such embodiments, constraining the ratio of the width $W_2$ to the width $W_1$ to less than about 1.53 allows the thickness $T_1$ of the IMC 164 to be less than the thickness $T_2$ of the metallization pattern 106. For example, the thickness $T_1$ of the IMC 164 may be less than about 6.5 μm, such as from about 3 μm to about 6 μm, and the difference in thickness $T_3$ may be greater than about 0.5 μm, such as from about 1 μm to about 2.5 μm.

After forming the conductive connectors 314 are formed, the first package 200 and second package 300 may be tested to determine reliability of the package. The testing process may subject the packages to high levels of heat. If the IMC 164 is formed completely through the metallization pattern 106, delamination of the seed layer 113 may occur during high-temperature testing. As such, although reliable connections may be formed during reflow, the connections may subsequently fail during testing.

Because the Cu concentration of the reflowable layer 402 is greater than the reflowable connectors 404, and because the reflowable layer 402 is formed with a Cu concentration of from about 5% to about 10%, the resulting conductive connectors 314 may have a Cu concentration of from about 0.55% by weight to about 0.7% by weight, such as greater than about 0.5% by weight. Such a concentration allows the IMC 164 to form, but reduces the amount of Cu consumed from the metallization pattern 106 during reflow. Reducing the amount of Cu consumed from the metallization pattern 106 may allow some pure Cu to remain in portions of the metallization pattern 106, avoiding delamination of the seed layer 113 during testing.

By forming the IMC 164 to have a thickness $T_1$ less than the thickness $T_2$ of the metallization pattern 106, some copper remains disposed between the IMC 164 and the seed layer 113 after the reflow process. The adhesion between the seed layer 113 and metallization pattern 106 may be stronger than adhesion between the seed layer 113 and IMC 164. As such, by forming the IMC 164 such that it does not extend all the way to the seed layer 113, delamination of the seed layer 113 may be avoided or reduced during testing.

In some embodiments, a solder resist (not shown) is formed on the side of the substrate 302 opposing the stacked dies 308. The conductive connectors 314 may be disposed in openings in the solder resist to be electrically and mechanically coupled to conductive features (e.g., the bond pads 304) in the substrate 302. The solder resist may be used to protect areas of the substrate 302 from external damage.

In some embodiments, the conductive connectors 314 have an epoxy flux (not shown) formed thereon before they are reflowed with at least some of the epoxy portion of the epoxy flux remaining after the second package 300 is attached to the first package 200.

In some embodiments, an underfill (not shown) is formed between the first package 200 and the second package 300 and surrounding the conductive connectors 314. The underfill may reduce stress and protect the joints resulting from the reflowing of the conductive connectors 314. The underfill may be formed by a capillary flow process after the first package 200 is attached or may be formed by a suitable deposition method before the first package 200 is attached. In embodiments where the epoxy flux is formed, it may act as the underfill.

Figure 19:
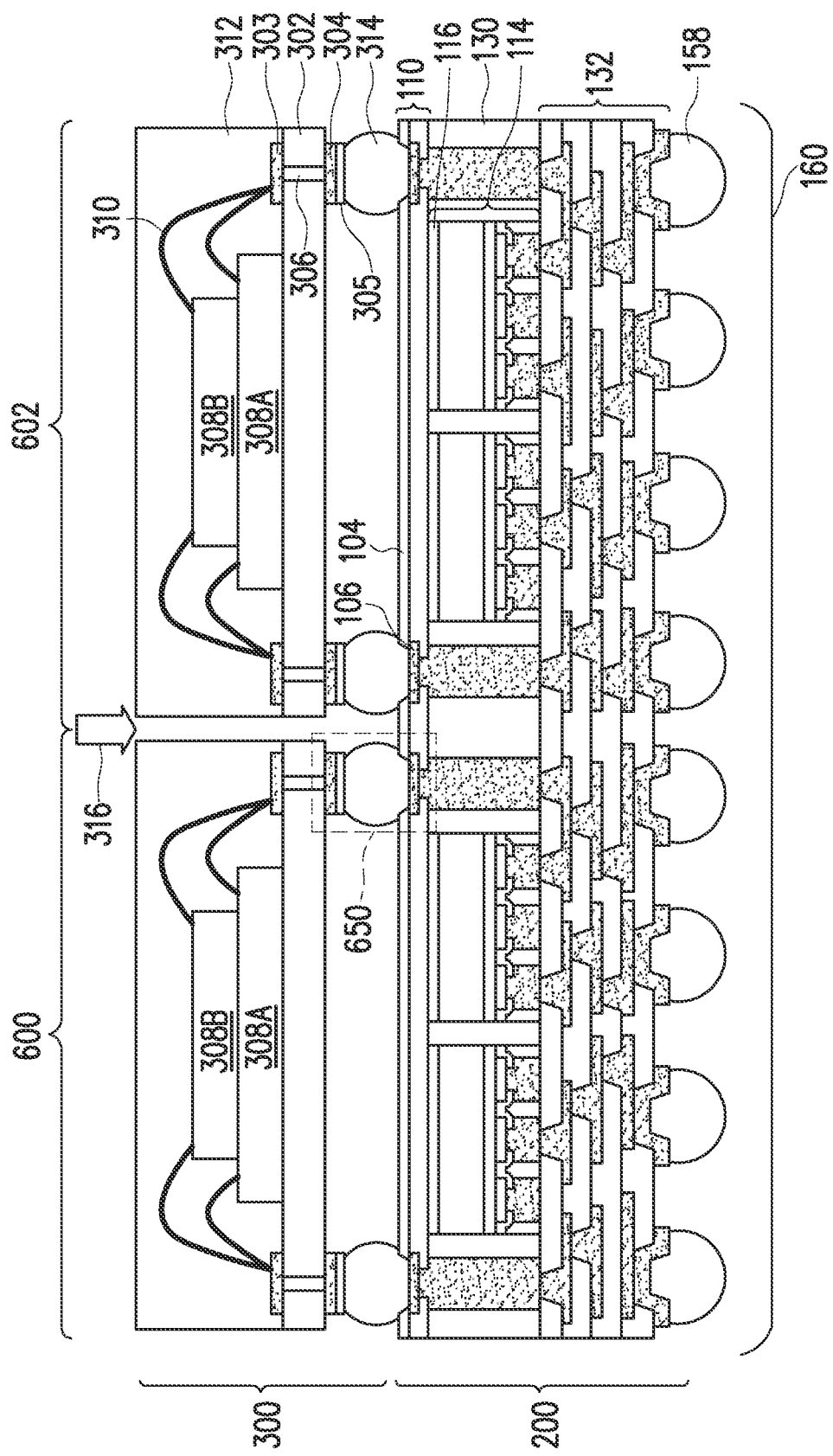

In FIG. 19, a singulation process 316 is performed by sawing along scribe line regions, e.g., between the first package region 600 and the second package region 602. The sawing singulates the first package region 600 from the second package region 602. The resulting, singulated first and second packages 200 and 300 are from one of the first package region 600 or the second package region 602. In some embodiments, the singulation process 316 is performed after the second package 300 is attached to the first package 200. In other embodiments (not shown), the singulation process 316 is performed before the second package 300 is attached to the first package 200, such as after the carrier substrate 100 is de-bonded and the openings 162 are formed.

Figure 20:
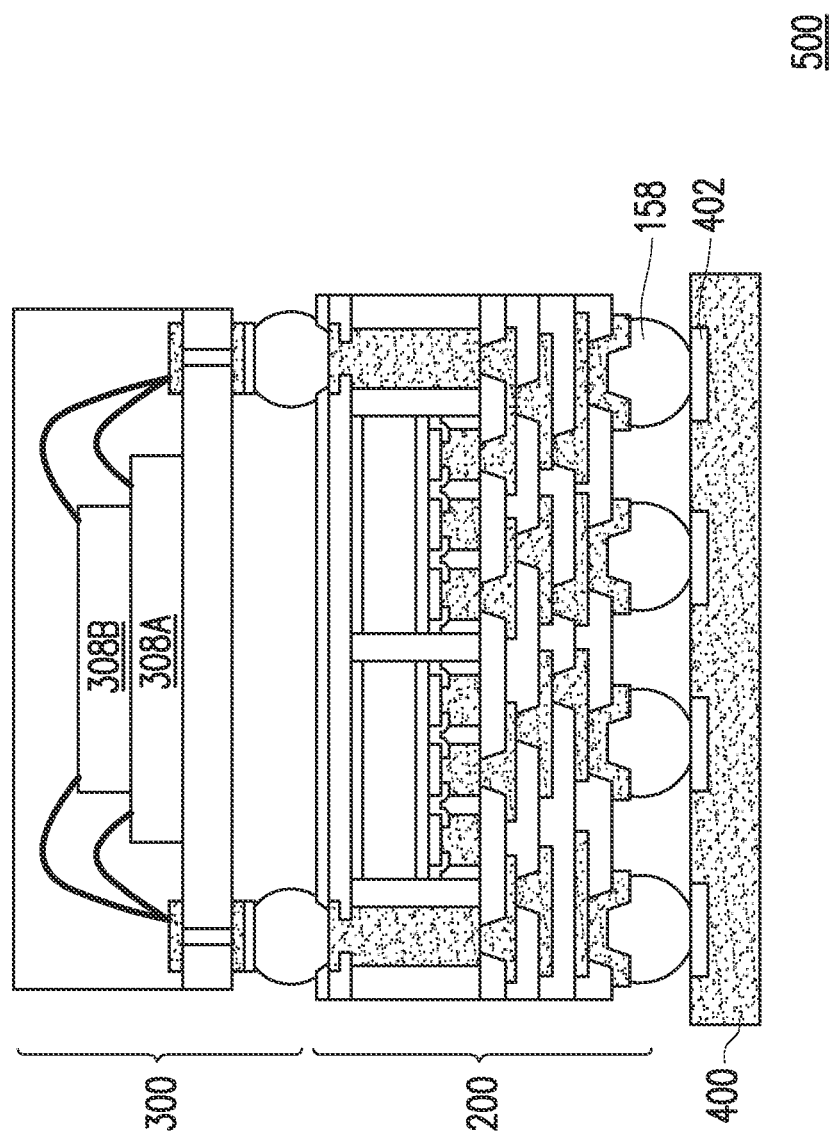

In FIG. 20, the first package 200 is mounted to a package substrate 400 using the conductive connectors 158. The package substrate 400 may be made of a semiconductor material such as silicon, germanium, diamond, or the like. Alternatively, compound materials such as silicon germanium, silicon carbide, gallium arsenic, indium arsenide, indium phosphide, silicon germanium carbide, gallium arsenic phosphide, gallium indium phosphide, combinations of these, and the like, may also be used. Additionally, the package substrate 400 may be a SOI substrate. Generally, an SOI substrate includes a layer of a semiconductor material such as epitaxial silicon, germanium, silicon germanium, SOI, SGOI, or combinations thereof. The package substrate 400 is, in one alternative embodiment, based on an insulating core such as a fiberglass reinforced resin core. One example core material is fiberglass resin such as FR4. Alternatives for the core material include bismaleimide-triazine BT resin, or alternatively, other PCB materials or films. Build up films such as ABF or other laminates may be used for package substrate 400.

The package substrate 400 may include active and passive devices (not shown). As one of ordinary skill in the art will recognize, a wide variety of devices such as transistors, capacitors, resistors, combinations of these, and the like may be used to generate the structural and functional requirements of the design for the package structure 500. The devices may be formed using any suitable methods.

The package substrate 400 may also include metallization layers and vias (not shown) and bond pads 402 over the metallization layers and vias. The metallization layers may be formed over the active and passive devices and are designed to connect the various devices to form functional circuitry. The metallization layers may be formed of alternating layers of dielectric (e.g., low-k dielectric material) and conductive material (e.g., copper) with vias interconnecting the layers of conductive material and may be formed through any suitable process (such as deposition, damascene, dual damascene, or the like). In some embodiments, the package substrate 400 is substantially free of active and passive devices.

In some embodiments, the conductive connectors 158 are reflowed to attach the first package 200 to the bond pads 402. The conductive connectors 158 electrically and/or physically couple the package substrate 400, including metallization layers in the package substrate 400, to the first package 200. In some embodiments, passive devices (e.g., surface mount devices (SMDs), not illustrated) may be attached to the first package 200 (e.g., bonded to the bond pads 402) prior to mounting on the package substrate 400. In such embodiments, the passive devices may be bonded to a same surface of the first package 200 as the conductive connectors 158.

The conductive connectors 158 may have an epoxy flux (not shown) formed thereon before they are reflowed with at least some of the epoxy portion of the epoxy flux remaining after the first package 200 is attached to the package substrate 400. This remaining epoxy portion may act as an underfill to reduce stress and protect the joints resulting from the reflowing the conductive connectors 158. In some embodiments, an underfill (not shown) may be formed between the first package 200 and the package substrate 400 and surrounding the conductive connectors 158. The underfill may be formed by a capillary flow process after the first package 200 is attached or may be formed by a suitable deposition method before the first package 200 is attached.

Embodiments may achieve advantages. Controlling the ratio of the width $W_2$ to the width $W_1$ to be less than 1.53 may allow the thickness of the IMC 164 to be controlled. Notably, by forming the IMC 164 to a thickness less than the thickness of the metallization pattern 106, some Cu may remain in the metallization pattern 106 between the conductive connectors 314 and seed layer 113. Delamination of the seed layer 113 during testing may therefore be reduced or avoided.

In an embodiment, a device includes: a back-side redistribution structure including: a metallization pattern on a first dielectric layer; and a second dielectric layer on the metallization pattern; a through via extending through the first dielectric layer to contact the metallization pattern; an integrated circuit die adjacent the through via on the first dielectric layer; a molding compound on the first dielectric layer, the molding compound encapsulating the through via and the integrated circuit die; a conductive connector extending through the second dielectric layer to contact the metallization pattern, the conductive connector being electrically connected to the through via; and an intermetallic compound at the interface of the conductive connector and the metallization pattern, the intermetallic compound extending only partially into the metallization pattern.

In some embodiments, the metallization pattern has a thickness of from about 6 µm to about 10 µm. In some embodiments, the intermetallic compound extends into the metallization pattern a distance of less than about 6.5 µm. In some embodiments, portions of the metallization pattern between the conductive connector and the through via have a thickness of greater than about 0.5 µm. In some embodiments, first portions of the conductive connector extending through the second dielectric layer have a first width, second portions of the conductive connector outside the second dielectric layer have a second width, and the ratio of the second width to the first width is less than 1.53. In some embodiments, first portions of the conductive connector extending through the second dielectric layer have a first width, the intermetallic compound has a second width, and the second width is greater than the first width. In some embodiments, the metallization pattern has a third width, and the second width is less than the third width.

In an embodiment, a method includes: forming a metallization pattern between a first dielectric layer and a second dielectric layer; patterning a first opening through the first dielectric layer, the first opening exposing a first side of the metallization pattern; depositing a seed layer in the first opening; patterning a second opening through the second dielectric layer, the second opening exposing a second side of the metallization pattern; placing a conductive connector in the second opening on the second side of the metallization pattern; and reflowing the conductive connector, thereby forming an intermetallic compound at the interface of the conductive connector and the metallization pattern, the metallization pattern separating the intermetallic compound from the seed layer.

In some embodiments, the method further includes: attaching an integrated circuit die to the first dielectric layer. In some embodiments, the method further includes: forming a molding compound encapsulating the integrated circuit die; and plating a conductive material on the seed layer, the conductive material extending through the molding compound and at least partially into the first dielectric layer. In some embodiments, the reflowing the conductive connector bonds a first substrate to the second side of the metallization pattern with the conductive connector. In some embodiments, after the reflowing, the conductive connector includes solder and copper. In some embodiments, the conductive connector has a graded concentration of the copper, the graded concentration of the copper decreasing in a direction extending away from the metallization pattern. In some embodiments, a first portion of the conductive connector extending through the second dielectric layer has a first width, a second portion of the conductive connector outside the second dielectric layer has a second width, and the ratio of the second width to the first width is less than 1.53.

In an embodiment, a method includes: forming a metallization pattern on a first dielectric layer; depositing a second dielectric layer on the metallization pattern and the first dielectric layer; forming a through via extending through the second dielectric layer to contact a first side of the metallization pattern; etching a first opening in the first dielectric layer exposing a second side of the metallization pattern; printing a first reflowable material in the first opening; and forming a second reflowable material on the first reflowable material, the first reflowable material and the second reflowable material including different concentrations of conductive materials; and reflowing the first reflowable material and the second reflowable material to form a conductive connector extending through the first dielectric layer, and an intermetallic compound at the interface of the metallization pattern and the conductive connector.

In some embodiments, forming the via includes: etching a second opening in the second dielectric layer exposing the first side of the metallization pattern; depositing a seed layer in the second opening; and plating a conductive material on the seed layer, the conductive material and the seed layer forming the via. In some embodiments, the method further includes: attaching an integrated circuit die to the second dielectric layer, the integrated circuit die adjacent the via; and encapsulating the via and the integrated circuit die with a molding compound. In some embodiments, the method further includes: attaching a substrate to the metallization pattern with the conductive connector. In some embodiments, the metallization pattern has a thickness of from about 6 µm to about 10 µm. In some embodiments, the first opening has a first width, the conductive connector has a second width, and the ratio of the second width to the first width is less than 1.53.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device comprising:
   a first dielectric layer;
   a second dielectric layer;
   a first metallization pattern between the first dielectric layer and the second dielectric layer, the first metallization pattern comprising a pure copper layer and an intermetallic compound, a thickness of the intermetallic compound being greater than a thickness of the pure copper layer;
   a through via extending through the first dielectric layer to contact the pure copper layer; and
   a reflowable connector extending through the second dielectric layer to contact the intermetallic compound, the intermetallic compound aligned with a center of the reflowable connector and a center of the pure copper layer, the reflowable connector being different than the intermetallic compound.

2. The device of claim 1 further comprising:
   an integrated circuit die adjacent the through via;
   a molding compound encapsulating the integrated circuit die and the through via;
   a third dielectric layer on the molding compound; and
   a second metallization pattern comprising a first via and a second via, the first via extending through the third dielectric layer to contact the through via, the second via extending through the third dielectric layer to contact a die connector of the integrated circuit die.

3. The device of claim 1, wherein a first portion of the reflowable connector extending through the second dielectric layer has a first width, a second portion of the reflowable connector outside the second dielectric layer has a second width, and the ratio of the second width to the first width is less than 1.53.

4. The device of claim 1, wherein a width of the intermetallic compound is less than a width of the pure copper layer.

5. The device of claim 1, wherein a first portion of the reflowable connector extending through the second dielectric layer has a first width, and a second width of the intermetallic compound is greater than the first width.

6. The device of claim 1 further comprising:
   a bond pad contacting the reflowable connector,
   wherein a concentration of copper in the reflowable connector decreases through the reflowable connector in a direction extending from the first metallization pattern to the bond pad.

7. The device of claim 6, wherein the bond pad comprises nickel.

8. A device comprising:
   a first package comprising:
      a metallization pattern comprising a pure copper layer and an intermetallic compound, a thickness of the intermetallic compound being greater than a thickness of the pure copper layer; and
      a through via connected to the metallization pattern, the pure copper layer disposed between the through via and the intermetallic compound;
   a second package comprising a bond pad, the bond pad comprising a nickel layer; and
   a conductive connector connecting the bond pad to the metallization pattern, the intermetallic compound disposed between the conductive connector and the pure copper layer, the intermetallic compound being distinct from the conductive connector.

9. The device of claim 8, wherein the first package further comprises:
   a dielectric layer, the conductive connector extending through an opening in the dielectric layer, the opening having a first width, the conductive connector having a second width, the ratio of the second width to the first width being less than 1.53.

10. The device of claim 8, wherein the first package further comprises:
    a dielectric layer, the conductive connector extending through an opening in the dielectric layer, the opening having a first width, the conductive connector having a second width, the intermetallic compound having a third width, the third width being less than the second width, the third width being greater than the first width.

11. The device of claim 8, wherein the conductive connector comprises solder and copper, a concentration of copper in the conductive connector decreasing through the conductive connector in a direction extending from the first package to the second package.

12. A device comprising:
    a first dielectric layer;
    a through via extending through the first dielectric layer;
    a conductive layer on the through via and the first dielectric layer, the conductive layer consisting essentially of copper;
    a second dielectric layer on the conductive layer;
    a reflowable connector extending through the second dielectric layer; and
    an intermetallic compound between the reflowable connector and the conductive layer, the reflowable connector being different than the intermetallic compound, the intermetallic compound having a first thickness, a first portion of the conductive layer between the intermetallic compound and each of the through via and the first dielectric layer having a second thickness, the second thickness less than the first thickness.

13. The device of claim 12, wherein a second portion of the conductive layer between the second dielectric layer and the first dielectric layer has a third thickness, the third thickness greater than the second thickness.

14. The device of claim 12 further comprising:
    an integrated circuit die adjacent the through via; and
    a molding compound encapsulating the integrated circuit die and the through via, the first dielectric layer disposed on the molding compound.

15. The device of claim 12, wherein the intermetallic compound is aligned with the reflowable connector.

16. The device of claim 12, wherein a width of the intermetallic compound is less than a width of the conductive layer.

17. The device of claim 12, wherein a first portion of the reflowable connector extending through the second dielectric layer has a first width, a second portion of the reflowable connector outside the second dielectric layer has a second width, the intermetallic compound has a third width, the third width being less than the second width, the third width being greater than the first width.

18. The device of claim 12, wherein a first portion of the reflowable connector extending through the second dielectric layer has a first width, a second portion of the reflowable connector outside the second dielectric layer has a second width, and the ratio of the second width to the first width is less than 1.53.

19. The device of claim 12 further comprising:
- a bond pad contacting the reflowable connector, the bond pad comprising nickel.

20. The device of claim 19, wherein the reflowable connector comprises solder and copper, a concentration of copper in the reflowable connector decreasing through the reflowable connector in a direction extending from the intermetallic compound to the bond pad.

* * * * *